United States Patent
Hur et al.

(10) Patent No.: US 11,837,618 B1
(45) Date of Patent: Dec. 5, 2023

(54) IMAGE SENSOR INCLUDING A PROTECTIVE LAYER

(71) Applicant: SAMSUNG ELECTRONICS CO., LTD., Suwon-si (KR)

(72) Inventors: Jaesung Hur, Yongin-si (KR); Taeksoo Jeon, Hwaseong-si (KR); Jongmin Baek, Seoul (KR); Sanghoon Ahn, Seongnam-si (KR); Jangho Lee, Hwaseong-si (KR); Kyu-Hee Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 217 days.

(21) Appl. No.: 16/999,926

(22) Filed: Aug. 21, 2020

(51) Int. Cl.
*H01L 27/146* (2006.01)

(52) U.S. Cl.
CPC .. *H01L 27/14627* (2013.01); *H01L 27/14621* (2013.01); *H01L 27/14623* (2013.01); *H01L 27/14685* (2013.01); *H01L 27/1463* (2013.01); *H01L 27/14645* (2013.01)

(58) Field of Classification Search
CPC ........... H01L 27/1463; H01L 27/14621; H01L 27/14623; H01L 27/14627; H01L 27/14645; H01L 27/14685
See application file for complete search history.

(56) References Cited

U.S. PATENT DOCUMENTS

| | | | |
|---|---|---|---|
| 7,081,407 B2 | 7/2006 | Annapragada et al. | |
| 7,678,682 B2 | 3/2010 | Waldfried et al. | |
| 7,994,600 B2 | 8/2011 | Jacobs et al. | |
| 8,236,684 B2 | 8/2012 | Chan et al. | |
| 8,592,327 B2 | 11/2013 | Ranjan et al. | |
| 9,793,108 B2 | 10/2017 | Ren et al. | |
| 9,899,439 B2 | 2/2018 | Miyashita | |
| 9,997,451 B2 | 6/2018 | Briggs et al. | |
| 10,049,921 B2 | 8/2018 | Draeger et al. | |
| 2016/0049293 A1 | 2/2016 | Li et al. | |
| 2017/0358488 A1 | 12/2017 | Cho et al. | |
| 2018/0277362 A1 | 9/2018 | Cho et al. | |
| 2018/0286744 A1 | 10/2018 | Yamaguchi et al. | |

(Continued)

FOREIGN PATENT DOCUMENTS

| | | |
|---|---|---|
| JP | 2013-076859 | 4/2013 |
| JP | 2018-207035 | 12/2018 |

(Continued)

*Primary Examiner* — Nelson Garces
(74) *Attorney, Agent, or Firm* — F. Chau & Associates, LLC

(57) ABSTRACT

An image sensor includes a semiconductor substrate having a plurality of pixel regions arranged in a first direction and a second direction that are parallel to an upper surface of the semiconductor substrate. The first direction is perpendicular to the second direction. A grid structure extends in the first direction and the second direction on the semiconductor substrate to define openings corresponding to a plurality of sub-pixel regions of the plurality of the pixel regions, respectively. Color filters are disposed in the openings of the grid structure, respectively. A protective layer covers sidewalls of the grid structure and bottom surfaces of the color filters. The protective layer includes silicon oxide including carbon (C) or nitrogen (N).

20 Claims, 33 Drawing Sheets

(56) References Cited

U.S. PATENT DOCUMENTS

2019/0148431 A1* 5/2019 Cheng ............... H01L 27/14627
　　　　　　　　　　　　　　　　　　　　　257/432
2020/0119072 A1* 4/2020 Lim .................... H01L 27/1462
2021/0366969 A1* 11/2021 Bak ................... H01L 27/14645

FOREIGN PATENT DOCUMENTS

KR　　10-2011-0072308　　6/2011
KR　　　　10-1107568　　1/2012

* cited by examiner

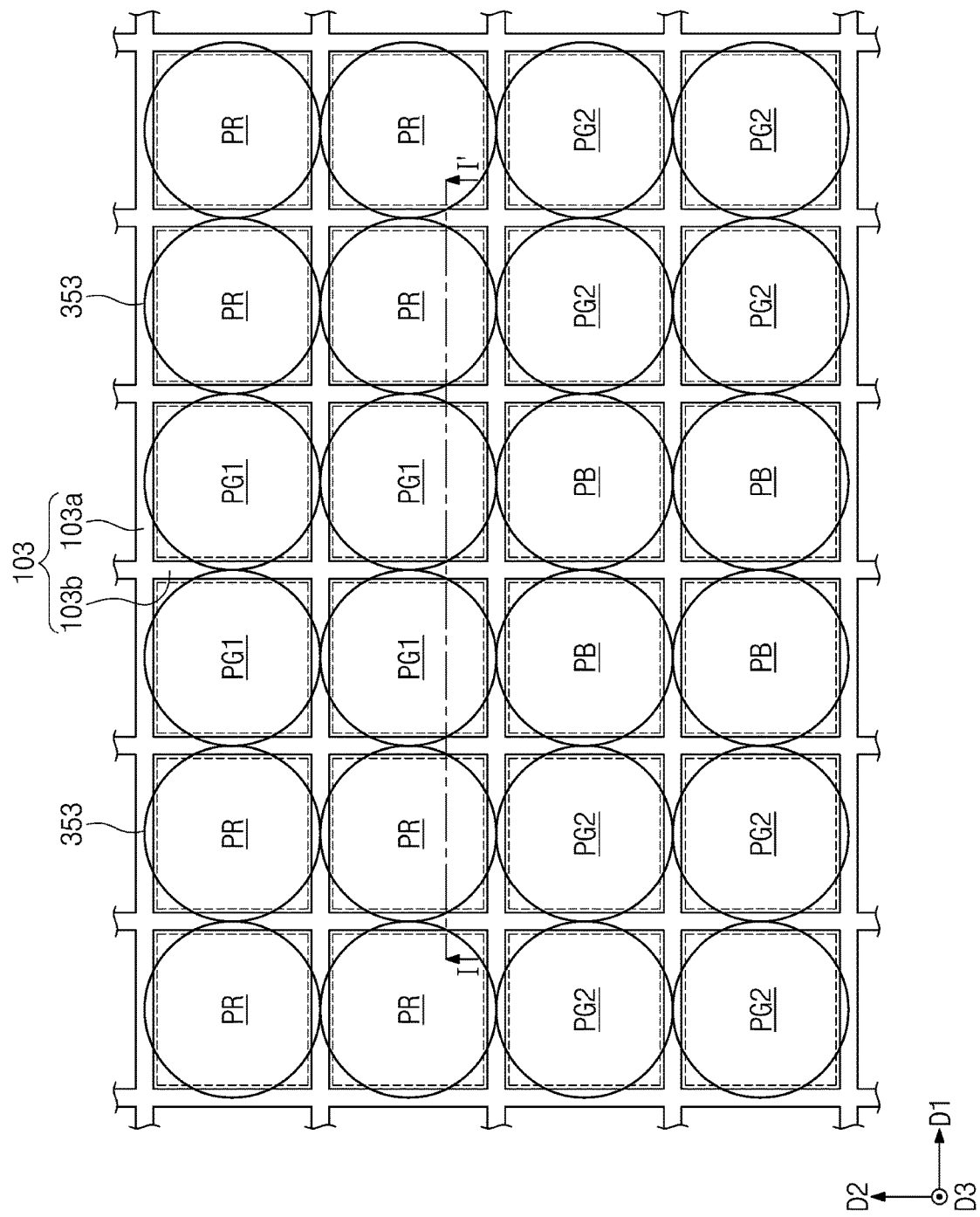

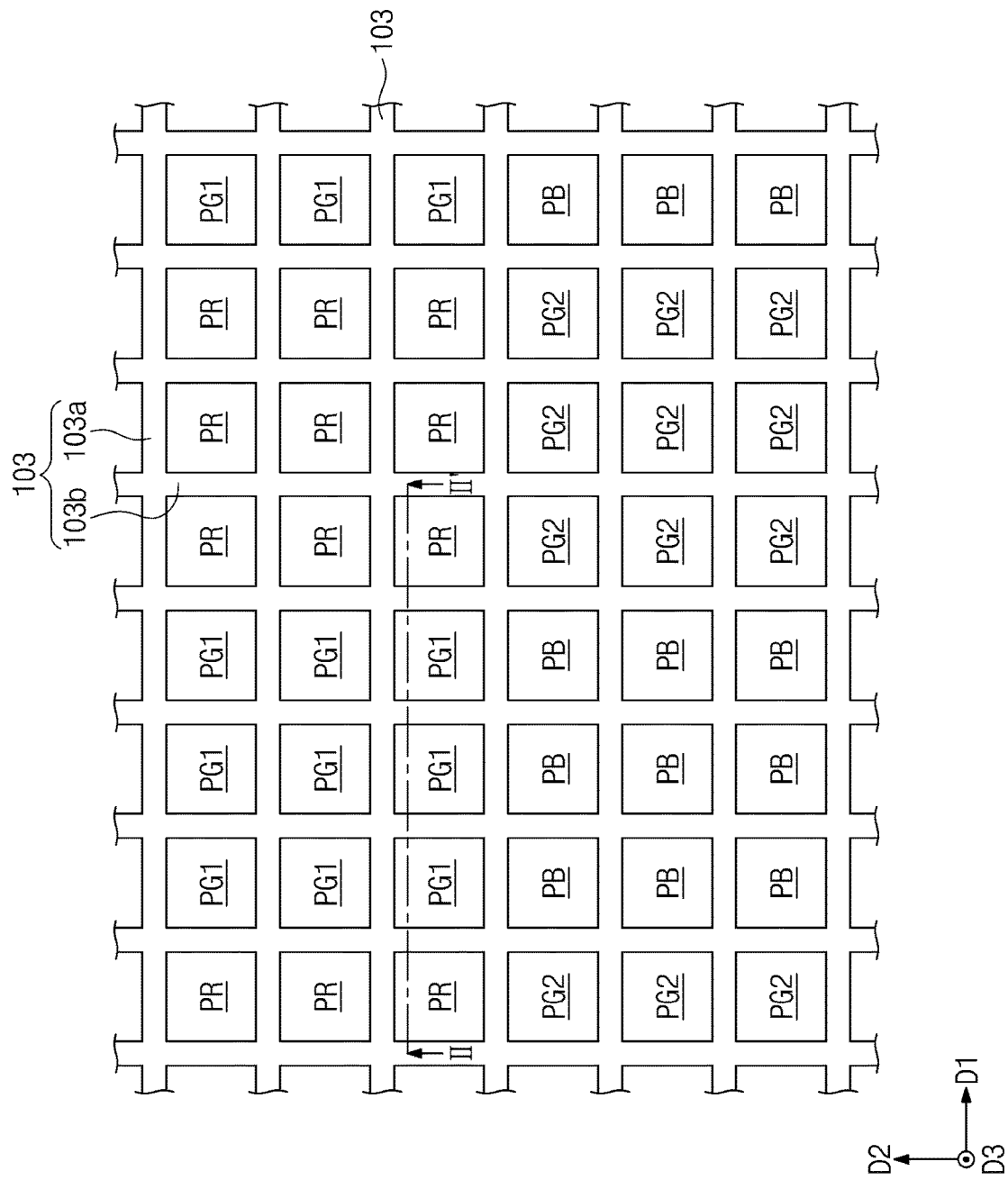

IMAGE SENSOR INCLUDING A PROTECTIVE LAYER

1. TECHNICAL FIELD

Exemplary embodiments of the present inventive concepts relate to an image sensor and a method for manufacturing the same, and more particularly, to an image sensor with improved optical characteristics and a method for manufacturing the same.

2. DISCUSSION OF RELATED ART

An image sensor may convert an optical image into an electrical signal. Recent technological developments, such as those in the computer and communication industries, have increasingly demanded high-performance image sensors to be applied in electronic devices, such as a digital camera, a camcorder, a personal communication system (PCS), a game console, a security camera, a medical micro camera, etc.

SUMMARY

Exemplary embodiments of the present inventive concepts may provide an image sensor with improved optical characteristics and a method for manufacturing the same.

According to an exemplary embodiment of the present inventive concepts, an image sensor includes a semiconductor substrate having a plurality of pixel regions arranged in a first direction and a second direction that are parallel to an upper surface of the semiconductor substrate. The first direction is perpendicular to the second direction. A grid structure extends in the first direction and the second direction on the semiconductor substrate to define openings corresponding to a plurality of sub-pixel regions of the plurality of the pixel regions, respectively. Color filters are disposed in the openings of the grid structure, respectively. A protective layer covers sidewalls of the grid structure and bottom surfaces of the color filters. The protective layer includes silicon oxide including carbon (C) or nitrogen (N).

According to an exemplary embodiment of the present inventive concepts, an image sensor includes a semiconductor substrate including a plurality of pixel regions having sub-pixel regions that are spaced apart from each other. A plurality of color filters is disposed on the semiconductor substrate and corresponds to the sub-pixel regions, respectively. A grid structure is disposed on the semiconductor substrate and is disposed between adjacent color filters of the plurality of color filters. A protective layer covers a top surface and sidewalls of the grid structure and bottom surfaces of the plurality of color filters. The grid structure includes a low-refractive index pattern having a low-refractive index region having pores. A buffer region surrounds the low-refractive index region and contacts the protective layer.

According to an exemplary embodiment of the present inventive concepts, an image sensor includes a semiconductor substrate including a first pixel region and a second pixel region including a first surface and a second surface opposite to each other. Each of the first and second pixel regions includes a plurality of sub-pixel regions. Photoelectric conversion regions are provided in each of the sub-pixel regions of the first and second pixel regions in the semiconductor substrate. A pixel isolation structure is disposed in the semiconductor substrate to define the sub-pixel regions of the first and second pixel regions. The pixel isolation structure surrounds each of the photoelectric conversion regions in a plan view. A micro lens array is disposed on the second surface of the semiconductor substrate and includes a plurality of micro lenses corresponding to the plurality of sub-pixel regions. A color filter array is provided between the micro lens array and the second surface of the semiconductor substrate. The color filter array includes first color filters corresponding to the sub-pixel regions of the first pixel region and second color filters corresponding to the sub-pixel regions of the second pixel region. A grid structure is provided on the second surface of the semiconductor substrate and is disposed between adjacent color filters of the color filter array. A protective layer covers sidewalls of the grid structure and bottom surfaces of the first and second color filters. The grid structure includes a low-refractive index pattern having pores, and the protective layer is spaced apart from the pores in the low-refractive index pattern.

According to an exemplary embodiment, a method for manufacturing an image sensor includes providing a semiconductor substrate including a plurality of pixel regions having sub-pixel regions. A planarization insulating layer is formed on the semiconductor substrate. A low-refractive index layer including pores is formed on the planarization insulating layer. The low-refractive index layer is patterned to form a low-refractive index pattern on the planarization insulating layer. The low-refractive index pattern defines openings corresponding to the sub-pixel regions of the plurality of pixel regions, respectively. A protective layer is formed that conformally covers the planarization insulating layer and the low-refractive index pattern including the openings. Color filters are formed in the openings. A surface treatment process is performed on the low-refractive index pattern before the forming of the protective layer.

BRIEF DESCRIPTION OF THE DRAWINGS

The present inventive concepts will become more apparent in view of the attached drawings and accompanying detailed description.

FIG. 4A is a plan view illustrating an image sensor according to an exemplary embodiment of the present inventive concepts.

FIG. 8A is a plan view illustrating an image sensor according to some embodiments of the inventive concepts.

DETAILED DESCRIPTION OF EXEMPLARY EMBODIMENTS

An image sensor and a method for manufacturing the same according to exemplary embodiments of the present inventive concepts will be described more fully hereinafter with reference to the accompanying drawings.

Figure 1:
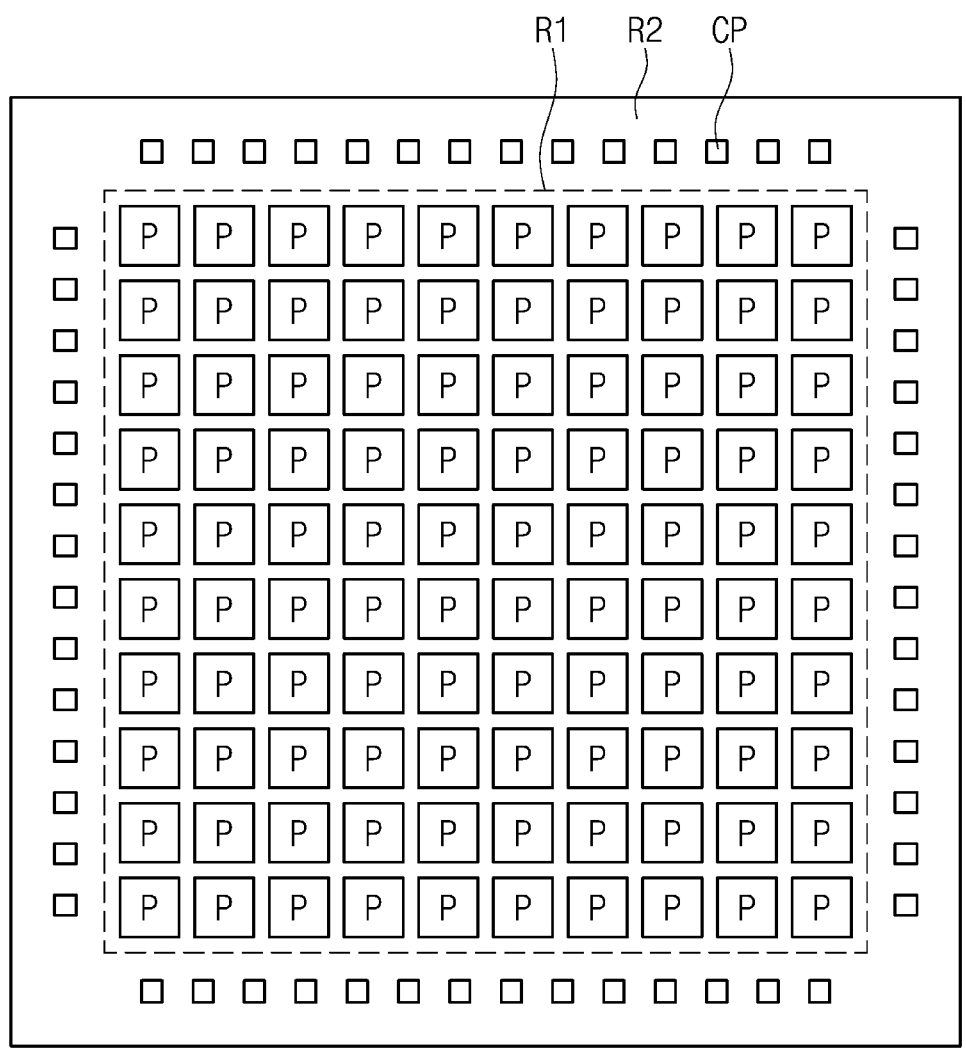
FIG. 1 is a plan view illustrating an image sensor according to an exemplary embodiment of the present inventive concepts.

FIG. 1 is a schematic plan view illustrating an image sensor according to an exemplary embodiment of the present inventive concepts.

Referring to the exemplary embodiment of FIG. 1, an image sensor may include a pixel array region R1 and a pad region R2.

A plurality of unit pixels P may be two-dimensionally arranged in a row direction and a column direction in the pixel array region R1. An electrical signal generated by incident light may be outputted from each of the unit pixels P of the pixel array region R1. A plurality of conductive pads CP used to input/output control signals and photoelectric signals may be disposed in the pad region R2. The pad region R2 may surround the pixel array region R1 in a plan view. Therefore, the pad region R2 may be easily connected to external devices. In the exemplary embodiment of FIG. 1, the pixel array region R1 is substantially square shaped and the pad region R2 surrounds each side of the pixel array region R1. However, exemplary embodiments of the present inventive concepts are not limited thereto and the pixel array region R1 may have various different shapes and/or the pad region R2 may not surround at least one side of the pixel array region R1.

Figure 2A:
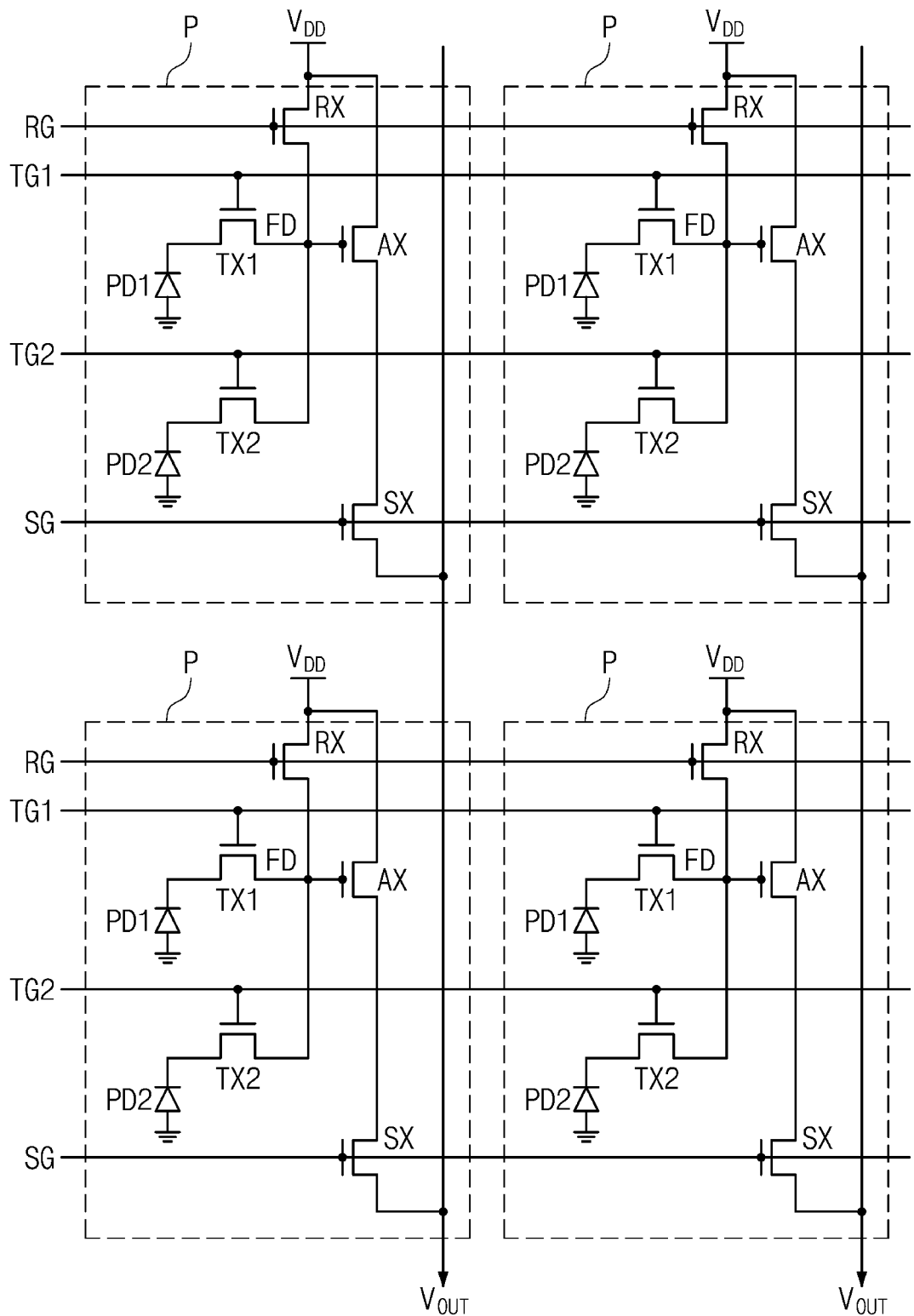
FIGS. 2A and 2B are circuit diagrams illustrating active pixel sensor arrays of image sensors according to exemplary embodiments of the present inventive concepts.
Figure 2B:
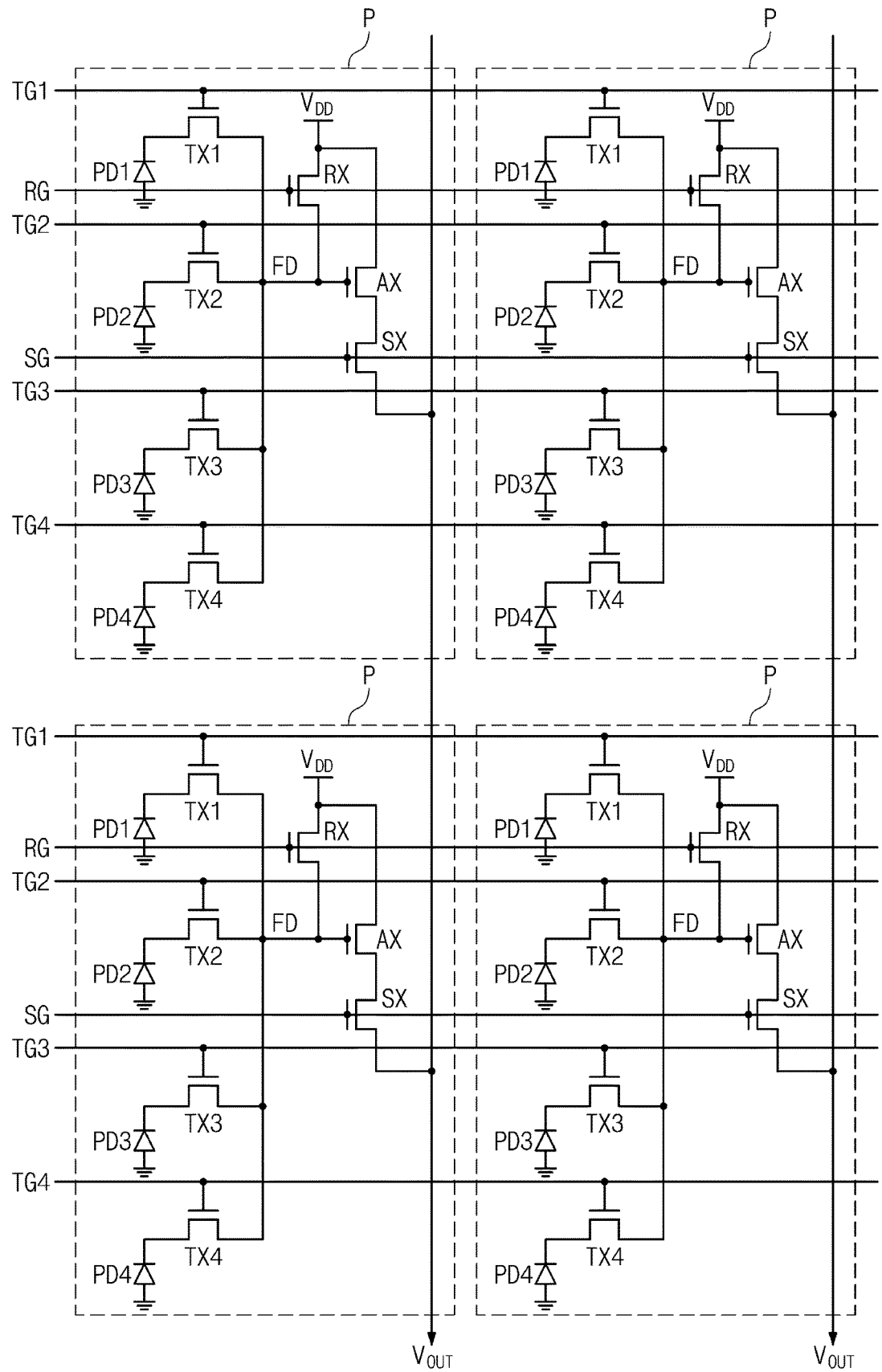

FIGS. 2A and 2B are circuit diagrams illustrating active pixel sensor arrays of image sensors according to exemplary embodiments of the present inventive concepts.

Referring to the exemplary embodiment of FIG. 2A, an active pixel sensor array may include a plurality of unit pixels P, and each of the unit pixels P may include first and second photoelectric conversion elements PD1 and PD2, first and second transfer transistors TX1 and TX2, and logic transistors (or readout transistors) which include a reset transistor RX, a selection transistor SX and an amplifying transistor AX. However, exemplary embodiments of the present inventive concepts are not limited thereto. Gate electrodes of the first and second transfer transistors TX1 and TX2, a gate electrode of the reset transistor RX and a gate electrode of the selection transistor SX may be connected to driving signal lines, respectively.

The first transfer transistor TX1 may include a first transfer gate electrode TG1 and the first photoelectric conversion element PD1, and the second transfer transistor TX2 may include a second transfer gate electrode TG2 and the second photoelectric conversion element PD2. In addition, the first and second transfer transistors TX1 and TX2 may share a charge detection node (e.g., a floating diffusion region) FD.

The first and second photoelectric conversion elements PD1 and PD2 may generate and accumulate photocharges in proportion to the amount of light incident from the outside. The first and second transfer gate electrodes TG1 and TG2 may transfer charges, which are accumulated in the first and second photoelectric conversion elements PD1 and PD2, into the charge detection node (e.g., the floating diffusion region) FD. Signals which are complementary to each other may be applied to the first and second transfer gate electrodes TG1 and TG2. For example, charges may be transferred from one of the first and second photoelectric conversion elements PD1 and PD2 into the charge detection node FD.

The charge detection node FD may receive the charges generated in the first and second photoelectric conversion elements PD1 and PD2 and may cumulatively store the received charges. The amplifying transistor AX may be controlled according to the amount of the photocharges accumulated in the charge detection node FD.

The reset transistor RX may periodically reset the charges accumulated in the charge detection node FD. For example, a drain electrode of the reset transistor RX may be connected to the charge detection node FD, and a source electrode of the reset transistor RX may be connected to a power voltage $V_{DD}$. When the reset transistor RX is turned-on, the power voltage $V_{DD}$ connected to the source electrode of the reset transistor RX may be transmitted to the charge detection node FD. Therefore, the charges accumulated in the charge detection node FD may be discharged to reset the charge detection node FD when the reset transistor RX is turned-on.

The amplifying transistor AX may amplify a change in potential of the charge detection node FD and may output the amplified signal (e.g., a pixel signal) to an output line $V_{OUT}$ through the selection transistor SX. In an exemplary embodiment, the amplifying transistor AX may be a source follower buffer amplifier that generates a source-drain current in proportion to the amount of the photocharges provided to a gate electrode thereof. A gate electrode of the amplifying transistor AX may be connected to the charge detection node FD and a drain electrode of the amplifying transistor AX may be connected to the power voltage $V_{DD}$. A source electrode of the amplifying transistor AX may be connected to a drain electrode of the selection transistor SX.

The selection transistor SX may select the unit pixels P to be sensed in a row. When the selection transistor SX is turned-on, the power voltage $V_{DD}$ connected to the drain electrode of the amplifying transistor AX may be transmitted to the drain electrode of the selection transistor SX.

Referring to the exemplary embodiment of FIG. 2B, in an exemplary embodiment, an active pixel sensor array may include a plurality of unit pixels P, and each of the unit pixels P may include first to fourth photoelectric conversion elements PD1, PD2, PD3 and PD4 and first to fourth transfer transistors TX1, TX2, TX3 and TX4. The first to fourth transfer transistors TX1, TX2, TX3 and TX4 may share the charge detection node FD and the logic transistors that include the reset transistor RX, the selection transistor SX and the amplifying transistor AX. In the exemplary embodiment of FIG. 2B, charges may be transferred from one of first to fourth photoelectric conversion elements PD1, PD2, PD3 and PD4 to the charge detection node FD in response to signals applied to first to fourth charge transfer lines.

Figure 3:
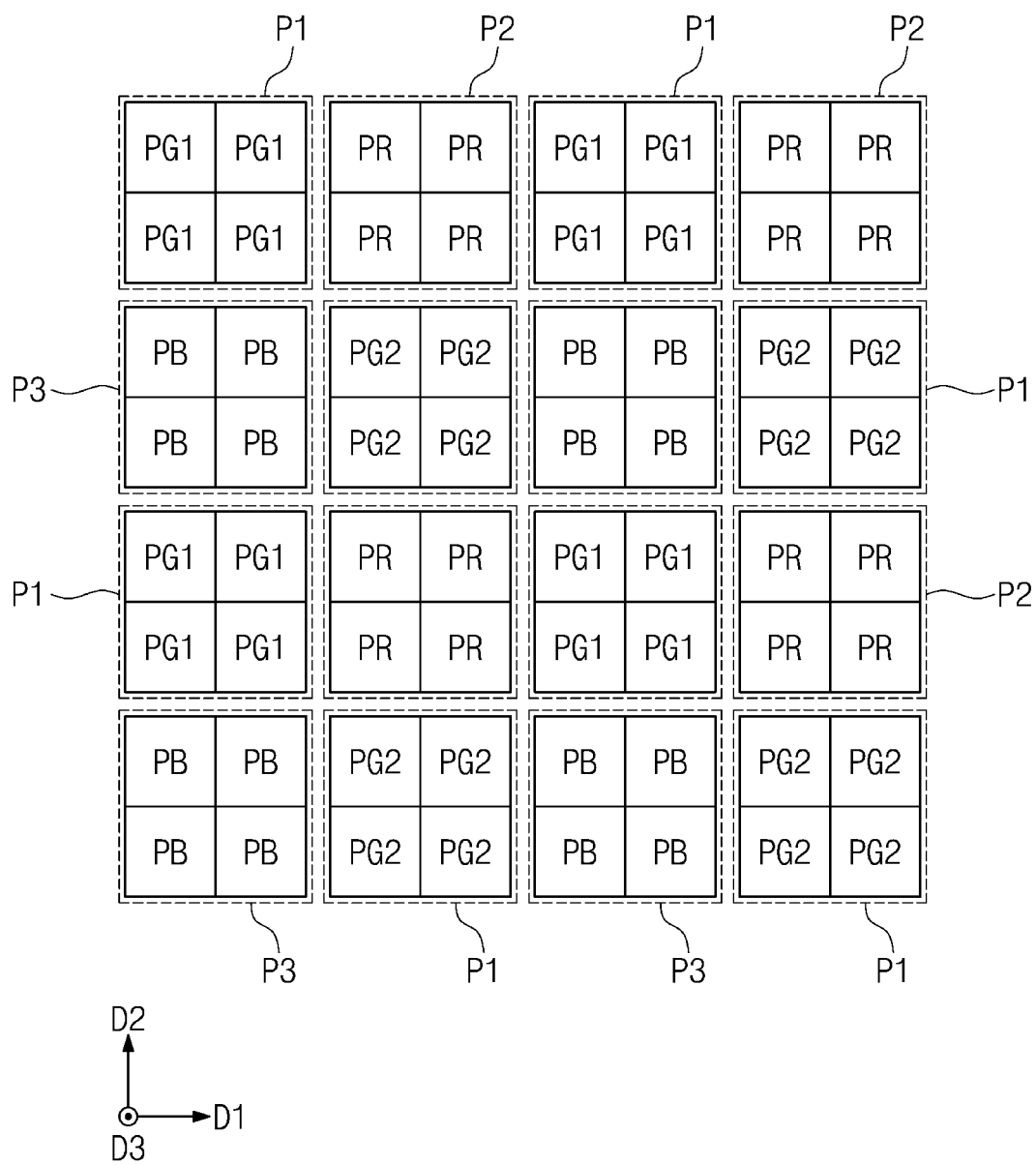
FIG. 3 is a plan view illustrating an active pixel sensor array of an image sensor according to an exemplary embodiment of the present inventive concepts.

FIG. 3 is a schematic plan view illustrating an active pixel sensor array of an image sensor according to an exemplary embodiment of the present inventive concepts.

Referring to the exemplary embodiment of FIG. 3, an active pixel sensor array may include a plurality of pixel regions arranged in a matrix form in a first direction D1 and a second direction D2 that is perpendicular to the first direction D1. The plurality of pixel regions may include first to third pixel regions P1, P2 and P3. However, exemplary embodiments of the present inventive concepts are not limited thereto and the number of pixel regions may vary. Lights of different wavelength bands may be incident on the first to third pixel regions P1, P2 and P3, respectively.

In an exemplary embodiment, the number of the first pixel regions P1 may be twice the number of the second or third pixel regions P2 or P3. The first pixel regions P1 may be arranged in a diagonal direction, and the second and third pixel regions P2 and P3 may be arranged in a diagonal direction. Each of the first pixel regions P1 may be disposed between the second pixel regions P2 in the first direction D1 and may be disposed between the third pixel regions P3 in the second direction D2.

Each of the first to third pixel regions P1, P2 and P3 may include a plurality of sub-pixel regions. In an exemplary embodiment, each of the first to third pixel regions P1, P2 and P3 may include the sub-pixel regions arranged in a 2×2 matrix form. However, exemplary embodiments of the present inventive concepts are not limited thereto. For example, each of the first pixel regions P1 may include a plurality of first sub-pixel regions PG1 and PG2. As shown in the exemplary embodiment of FIG. 3, each of the first pixel regions P1 may include one of the first sub-pixel regions PG1 or PG2. Each of the second pixel regions P2 may include a plurality of second sub-pixel regions PR. Each of the third pixel regions P3 may include a plurality of third sub-pixel regions PB. As shown in the exemplary embodiment of FIG. 3, the first sub-pixel regions PG1 may be disposed between the second sub-pixel regions PR (e.g., in the first direction D1) and the first sub-pixel regions PG2 may be disposed between the third sub-pixel regions PB (e.g., in the second direction D2)

In an exemplary embodiment, light of a first wavelength band may be incident on the first sub-pixel regions PG1 and PG2, and light of a second wavelength band longer than the first wavelength band may be incident on the second sub-pixel region PR. Light of a third wavelength band shorter than the first wavelength band may be incident on the third sub-pixel region PB. For example, green light may be incident on the first sub-pixel regions PG1 and PG2, red light may be incident on the second sub-pixel region PR, and blue light may be incident on the third sub-pixel region PB.

In an exemplary embodiment, each of the first to third sub-pixel regions PG1, PG2, PB and PR may include the photoelectric conversion element and the transfer transistor which are described with reference to the exemplary embodiments of FIGS. 2A and 2B. For example, each of the first to third sub-pixel regions PG1, PG2, PB and PR may include the unit pixel described with reference to the exemplary embodiments of FIG. 2A or 2B.

Figure 4B:
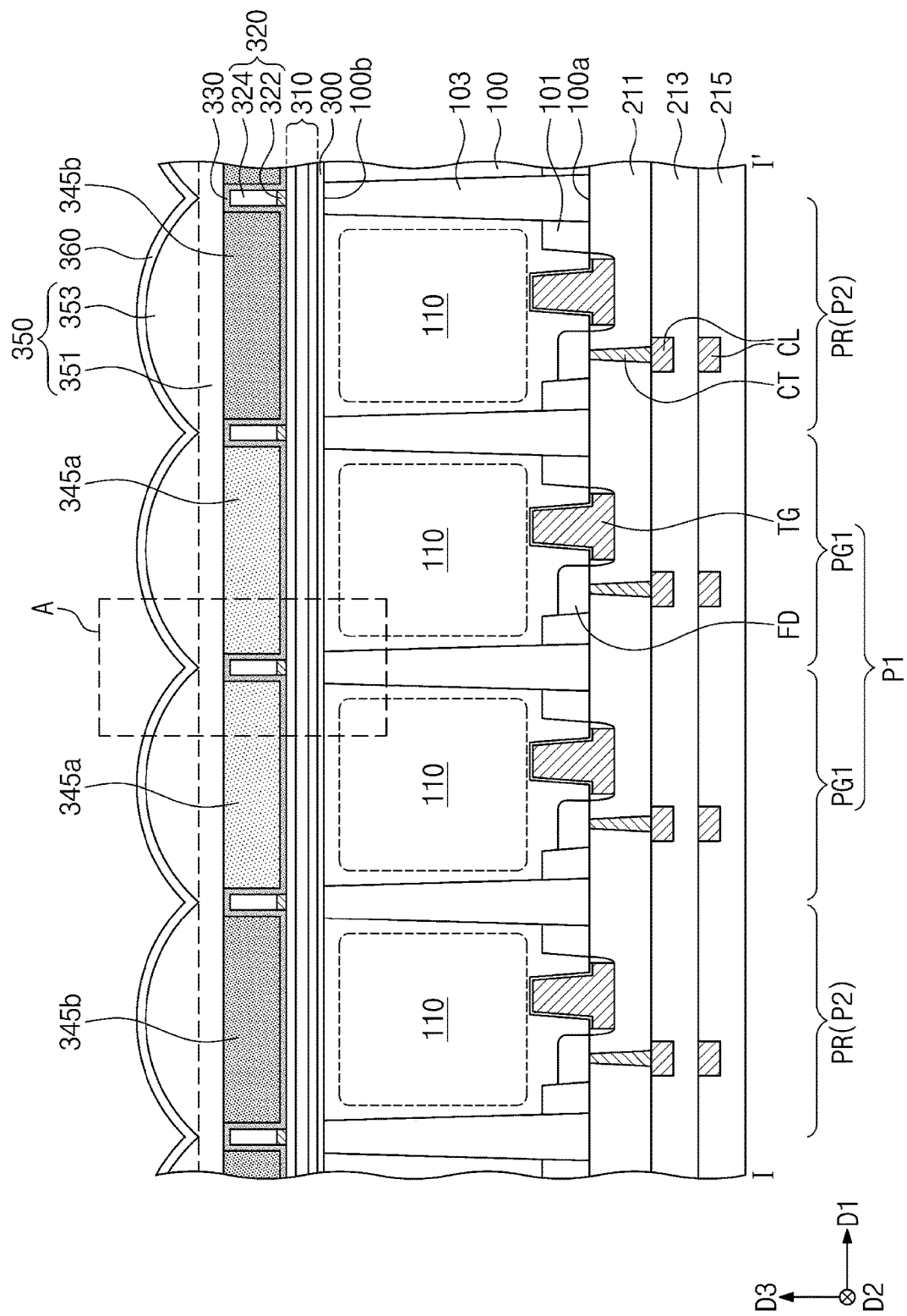
FIG. 4B is a cross-sectional view of an image sensor taken along line I-I' of FIG. 4A according to an exemplary embodiment of the present inventive concepts.

FIG. 4A is a plan view illustrating an image sensor according to an exemplary embodiment of the present inventive concepts. FIG. 4B is a cross-sectional view taken along a line I-I' of FIG. 4A to illustrate an image sensor according to an exemplary embodiment of the present inventive concepts. FIGS. 5A to 5D are enlarged views of a portion A of FIG. 4B according to exemplary embodiments of the present inventive concepts.

Referring to FIGS. 4A and 4B, an image sensor according to exemplary embodiments of the present inventive concepts may include a semiconductor substrate 100 in which photoelectric conversion regions 110 are provided, a readout circuit layer provided on a first surface (or a front surface) 100a of the semiconductor substrate 100, and a light transmitting layer provided on a second surface (or a back surface) 100b of the semiconductor substrate 100.

For example, the semiconductor substrate 100 may have the first surface 100a and the second surface 100b which are opposite to each other in a third direction D3 that is perpendicular to the first direction D1 and the second direction D2. In an exemplary embodiment, the semiconductor substrate 100 may be a substrate in which an epitaxial layer having a first conductivity type (e.g., a P-type) is formed on a bulk silicon substrate having the first conductivity type. Alternatively, in another exemplary embodiment, the semiconductor substrate 100 may be the P-type epitaxial layer remaining after removing the bulk silicon substrate in a process of manufacturing the image sensor. In an exemplary embodiment, the semiconductor substrate 100 may be a bulk semiconductor substrate including a well having the first conductivity type.

The semiconductor substrate 100 may include first to third pixel regions P1, P2 and P3 as described above with reference to the exemplary embodiment of FIG. 3, and lights of different wavelength bands may be incident on the first to third pixel regions P1, P2 and P3, respectively.

Each of the first to third pixel regions P1, P2 and P3 may include a plurality of sub-pixel regions PG1, PG2, PB or PR as described above. Each of the first pixel regions P1 may include a plurality of first sub-pixel regions PG1 or PG2, and each of the second pixel regions P2 may include a plurality of second sub-pixel regions PR. Each of the third pixel regions P3 may include a plurality of third sub-pixel regions PB. The sub-pixel regions PG1, PG2, PB and PR of the first to third pixel regions P1, P2 and P3 may have the same size and may be defined by a pixel isolation structure 103. For example, at least two first sub-pixel regions PG1 may be disposed between the second sub-pixel regions PR adjacent to each other (e.g., in the first direction D1).

The pixel isolation structure 103 may extend vertically (e.g., in the third direction D3) from the first surface 100a to the second surface 100b of the semiconductor substrate 100. The pixel isolation structure 103 may penetrate the semiconductor substrate 100. For example, the vertical thickness of the pixel isolation structure 103 (e.g., in the third direction D3) may be substantially equal to a vertical thickness of the semiconductor substrate 100. In an exemplary embodiment, the pixel isolation structure 103 may vertically extend from the first surface 100a toward the second surface 100b of the semiconductor substrate 100 but may be spaced apart from the second surface 100b of the semiconductor substrate 100.

A first width of the pixel isolation structure 103 (e.g., length in the first direction D1) adjacent to the first surface 100a of the semiconductor substrate 100 may be greater than a second width (e.g., length in the first direction D1) of the pixel isolation structure 103 adjacent to the second surface 100b of the semiconductor substrate 100. For example, as shown in the exemplary embodiment of FIG. 4B, the width of the pixel isolation structure 103 may be tapered by becoming gradually smaller from the first surface 100a toward the second surface 100b of the semiconductor substrate 100. However, exemplary embodiments of the present inventive concepts are not limited thereto and in another exemplary embodiment, the pixel isolation structure 103 may have a substantially uniform width (e.g., length in the first direction D1) and may penetrate the semiconductor substrate 100.

The pixel isolation structure 103 may surround each of the first to third sub-pixel regions P01, PG2, PR and PB when viewed in a plan view (e.g., in a plane defined by the first direction D1 and the second direction D2). In an exemplary embodiment, the pixel isolation structure 103 may include first portions 103a extending in the first direction D1 in parallel to each other and spaced apart from each other in the second direction D2, and second portions 103b extending in parallel in the second direction D2 to intersect the first portions 103a and spaced apart from each other in the first direction D1.

In an exemplary embodiment, a width (e.g., length in the first direction D1 or second direction D2) of each of the first to third sub-pixel regions PG1, PG2, PR and PB may correspond to a distance between immediately adjacent first portions 103a or a distance between the immediately adjacent second portions 103b. For example, in an exemplary embodiment, a pitch (e.g., distance between immediately adjacent first portions 103a in the second direction D2) of the first portions 103a of the pixel isolation structure 103 may be in a range from about 50 µm to about 100 µm. For example, the pitch of the first portions 103a of the pixel isolation structure 103 may be about 70 µm.

The pixel isolation structure 103 may be formed of an insulating material of which a refractive index is lower than the refractive index of the semiconductor substrate (e.g., silicon) 100. The pixel isolation structure 103 may include a single insulating layer or a plurality of insulating layers. For example, in an exemplary embodiment, the pixel isolation structure 103 may be formed of a silicon oxide layer, a silicon nitride layer, an undoped poly-silicon layer, air, or any combination thereof. The pixel isolation structure 103 may prevent a crosstalk phenomenon between the first to third sub-pixel regions PG1, PG2, PR and PB adjacent to each other.

The photoelectric conversion regions 110 may be provided in each of the first to third sub-pixel regions PG1, PG2, PR and PB, respectively. In an exemplary embodiment, the photoelectric conversion regions 110 may be formed by ion-implanting dopants of a second conductivity type into the semiconductor substrate 100. The second conductivity type may be opposite to the first conductivity type of the semiconductor substrate 100. Photodiodes may be formed by the junction of the semiconductor substrate 100 having the first conductivity type and the photoelectric conversion regions 110 having the second conductivity type. The photoelectric conversion regions 110 may generate photocharges in proportion to the intensity of incident light.

In an exemplary embodiment, a dopant concentration of a region of the photoelectric conversion region 110 adjacent to the first surface 100a may be different from a dopant concentration of another region of the photoelectric conversion region 110 adjacent to the second surface 100b. Therefore, the photoelectric conversion region 110 may have a potential gradient between the first surface 100a and the second surface 100b of the semiconductor substrate 100. For example, each of the photoelectric conversion regions 110 may include a plurality of dopant regions vertically stacked (e.g., in the third direction D3).

A device isolation layer 101 may be disposed on the first surface 100a of the semiconductor substrate 100 in each of the first to third sub-pixel regions PG1, PG2, PR and PB. The device isolation layer 101 may contact side portions of the pixel isolation structure 103. The device isolation layer 101 may define an active portion in the semiconductor substrate 100.

Readout circuits may be disposed on the first surface 100a of the semiconductor substrate 100. The readout circuits may include the MOS transistors described with reference to the exemplary embodiments of FIG. 2A or 2B. A transfer gate electrode TG may be disposed on the first surface 100a of the semiconductor substrate 100 of each of the sub-pixel regions PG1, PG2, PR and PB, and the readout circuit of FIG. 2A or 2B may also be provided thereon.

The transfer gate electrode TG may be disposed in a central portion of each of the sub-pixel regions PG1, PG2, PR and PB when viewed in a plan view. A portion of the transfer gate electrode TG may be disposed in the semiconductor substrate 100, and a gate insulating layer may be disposed between the transfer gate electrode TG and the semiconductor substrate 100. A floating diffusion region FD may be provided in the semiconductor substrate 100 at a side of the transfer gate electrode TG. For example, as shown in the exemplary embodiment of FIG. 48, the floating diffusion region FD may be positioned adjacent to the transfer gate electrode TG in the first direction D1. The floating diffusion region FD may be formed by ion-implanting dopants having a conductivity type that is opposite to the conductivity type of the semiconductor substrate 100. For example, the floating diffusion region FD may be an N-type dopant region.

First, second and third interlayer insulating layers 211, 213 and 215 may be stacked on the first surface 100a of the semiconductor substrate 100. However, exemplary embodiments of the present inventive concepts are not limited thereto and in other exemplary embodiments, the number of the interlayer insulating layers may vary. The first, second and third interlayer insulating layers 211, 213 and 215 may cover the MOS transistors of the readout circuits and the transfer gate electrodes TG. In an exemplary embodiment, each of the first, second and third interlayer insulating layers 211, 213 and 215 may include at least one compound selected from silicon oxide, silicon nitride, or silicon oxynitride. Connection lines CL may be disposed on each of the first, second and third interlayer insulating layers 211, 213 and 215. The connection lines CL may be electrically connected to the readout circuits through contact plugs CT.

A fixed charge layer 300 may be disposed on the second surface 100b of the semiconductor substrate 100. The fixed charge layer 300 may prevent charges (e.g., electrons or holes), which are generated by defects existing on the second surface 100b of the semiconductor substrate 100, from moving into the photoelectric conversion regions 110. In exemplary embodiments, the fixed charge layer 300 may include a single layer or a multi-layer. For example, in an exemplary embodiment, the fixed charge layer 300 may include a metal oxide layer or metal fluoride layer including at least one compound selected from hafnium (H), zirconium (Zr), aluminum (Al), tantalum (Ta), titanium (Ti), yttrium (Y), and a lanthanoid (e.g., La, etc.). For example, the fixed charge layer 300 may include an aluminum oxide layer and/or a hafnium oxide layer. In an exemplary embodiment, the thickness (e.g., length in the third direction D3) of the fixed charge layer 300 may range from about 1 nm to about 50 nm.

A planarization insulating layer 310 may be disposed on the fixed charge layer 300. As shown in the exemplary embodiment of FIG. 5A, the planarization insulating layer 310 may include a first planarization layer 311, a second planarization layer 313 and a third planarization layer 315, which are sequentially stacked (e.g., in the third direction D3). In an exemplary embodiment, each of the first to third planarization layers 311, 313 and 315 may be formed of a transparent insulating material. The first to third planarization layers 311, 313 and 315 may have different refractive indexes. The first to third planarization layers 311, 313 and 315 may be coupled to each other with appropriate thicknesses to have a high transmittance. For example, the first planarization layer 311 may be thicker (e.g., length in the third direction D3) than the fixed charge layer 3x. The second planarization layer 313 may be thicker than the first planarization layer 311. The third planarization layer 315 may be thinner than the second planarization layer 313.

In an exemplary embodiment, the first and third planarization layers 311 and 315 may have the same refractive index, and the second planarization layer 313 may have a different refractive index from the refractive index of the first and third planarization layers 311 and 315. For example, in an exemplary embodiment, the first and third planarization layers 311 and 315 may include a metal oxide, and the second planarization layer 313 may include silicon oxide. However, exemplary embodiments of the present inventive concepts are not limited thereto.

A grid structure 320 may be disposed on the planarization insulating layer 310. Like the pixel isolation structure 103, the grid structure 320 may have a grid shape when viewed in a plan view (e.g., in a plane defined by the first direction D1 and the second direction D2). The grid structure 320 may overlap with the pixel isolation structure 103 when viewed in a plan view. For example, the grid structure 320 may include first portions extending in the first direction D1, and second portions extending in the second direction D2 to intersect the first portions. The grid structure 320 may be disposed between the photoelectric conversion regions 110 of the sub-pixel regions PG1, PG2, PR and PB when viewed in a plan view. A width of the grid structure 320 may be substantially equal to or less than the minimum width of the pixel isolation structure 103.

The grid structure 320 may define an opening by a pair of the first portions extending in the first direction D1 and a pair of the second portions extending in the second direction D2, and the opening may overlap (e.g., in the third direction D3) with the photoelectric conversion region 110 of each of the sub-pixel regions PG1, PG2, PR and PB. The openings defined by the grid structure 320 may correspond to the sub-pixel regions PG1, PG2, PR and PB of the first to third pixel regions P1, P2 and P3.

The grid structure 320 may refract or reflect light obliquely incident through a micro lens 353 to allow the light to be incident to the photoelectric conversion region 110 of a corresponding sub-pixel region PG1, PG2, PR or PB. In an exemplary embodiment, an aspect ratio of the grid structure 320 may range from about 2:1 to about 5:1. However, in another exemplary embodiment, the aspect ratio of the grid structure may be in a range of from about 2:1 to about 12:1. For example, a height of the grid structure 320 (e.g., length in the third direction D3) may range from about 2000 Å to about 7000 Å. A width of the grid structure 320 (e.g., length in the first direction D1) may range from about 50 nm to about 150 nm.

The grid structure 320 may include a light blocking pattern 322 and a low-refractive index pattern 324, which are sequentially stacked (e.g., in the third direction D3). The light blocking pattern 322 may be disposed between the low-refractive index pattern 324 and the planarization insulating layer 310. In an exemplary embodiment, the light blocking pattern 322 may include a metal material such as at least one compound selected from titanium, tantalum, and tungsten. However, exemplary embodiments of the present inventive concepts are not limited thereto.

The low-refractive index pattern 324 may be formed of a material having a refractive index that is lower than the refractive indexes of first to third color filters 345a and 345b. For example, in an exemplary embodiment, the low-refractive index pattern 324 may have a refractive index in a range of about 1.1 to about 1.3. Since the low-refractive index pattern 324 has a low refractive index, the amount of light incident to the photoelectric conversion region 110 may be increased and crosstalk between the sub-pixel regions PG1, PG2, PR and PB may be reduced. Therefore, the light receiving efficiency of the photoelectric conversion regions 110 may be increased, and signal-to-noise ratio (SNR) characteristics of the photoelectric conversion regions 110 may be improved.

The low-refractive index pattern 324 may include a dielectric including pores 324P. In an exemplary embodiment, sizes (e.g., diameters) of the pores 324P in the low-refractive index pattern 324 may be in a range of several Å to several tens Å. For example, in an exemplary embodiment, the sizes of the pores 324P may be in a range of about 3 Å to about 50 Å. In an exemplary embodiment, the low-refractive index pattern 324 may have a porosity of about 5 vol % to about 50 vol %. In an exemplary embodiment, the low-refractive index pattern 324 may include at least one compound selected from SiOCH, SiOC, and SiOF.

Figure 5A:
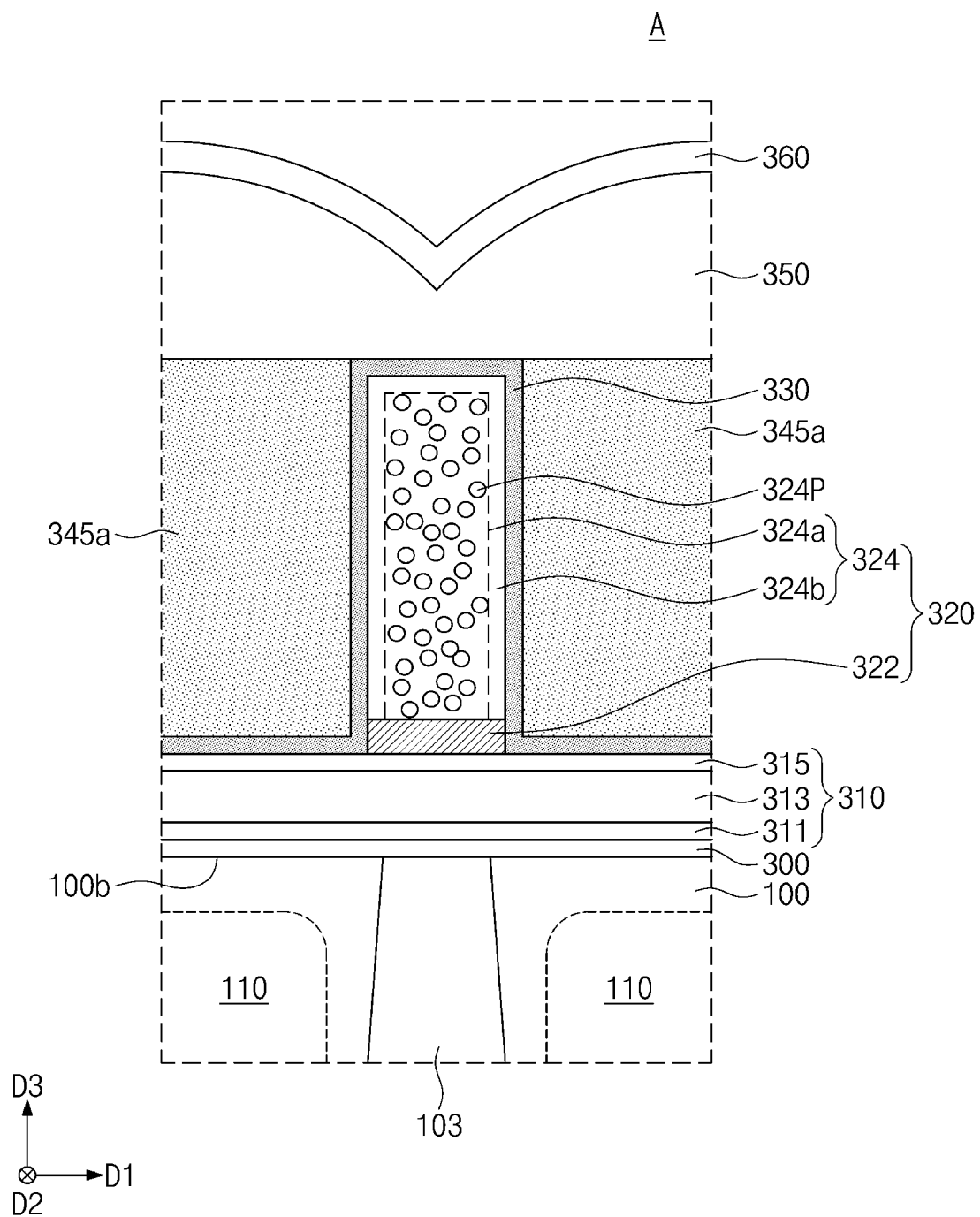
FIGS. 5A to 5D are enlarged views of portion A of FIG. 4B according to exemplary embodiments of the present inventive concepts.

Referring to the exemplary embodiments of FIGS. 4B and 5A, the low-refractive index pattern 324 may include a low-refractive index region 324a including the pores 324P, and a buffer region 324b surrounding the low-refractive index region 324a. The buffer region 324b may directly contact a protective layer 330.

As illustrated in the exemplary embodiment of FIG. 5A, a thickness of the buffer region 324b may be substantially uniform along a top surface and sidewalls of the low-refractive index pattern 324. Alternatively, as illustrated in the exemplary embodiment of FIG. 5B, a thickness T1 (e.g., length in the third direction D3) of the buffer region 324b at the top surface of the low-refractive index pattern 324 may be greater than a thickness T2 (e.g., length in the first direction D1) of the buffer region 324b at the sidewalls of the low-refractive index pattern 324.

Figure 5B:
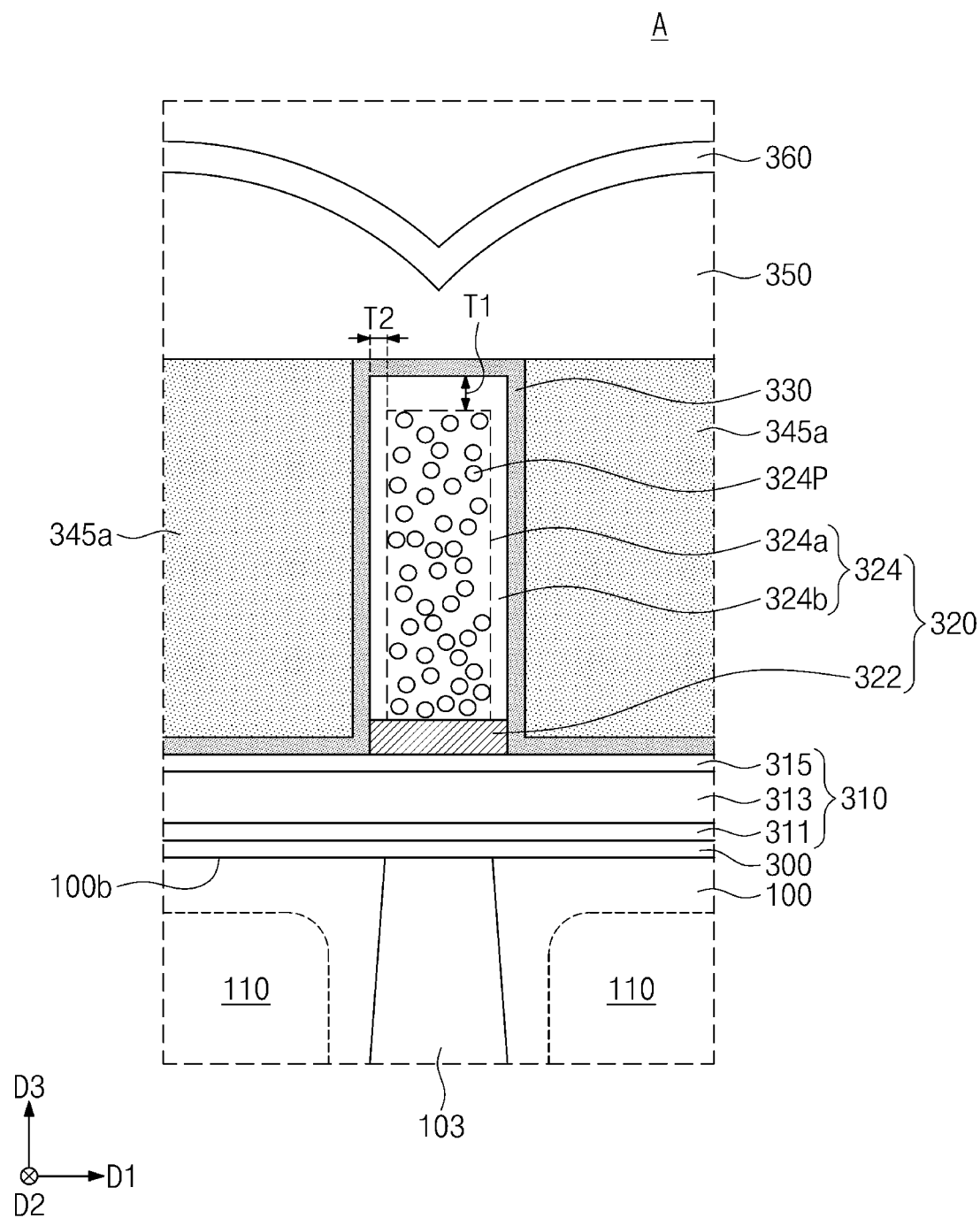

Referring to the exemplary embodiments of FIGS. 5A and 5B, a density of the pores 324P in the buffer region 324b of the low-refractive index pattern 324 may be less than a density of the pores 324P in the low-refractive index region 324a. For example, as shown in FIGS. 5A-5B, in some exemplary embodiments, the buffer region 324b may not include any pores 324P.

Figure 5C:
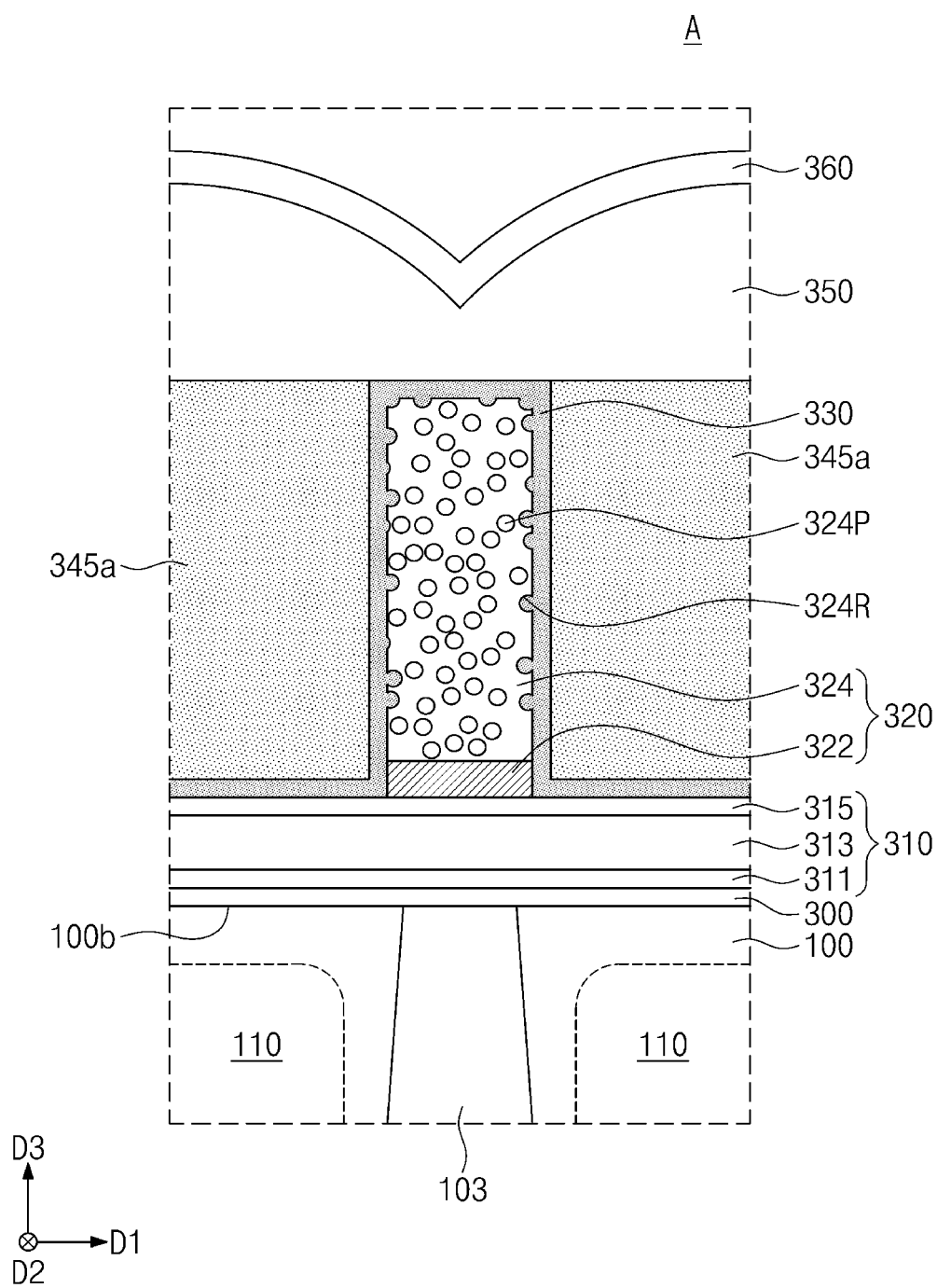
Figure 5D:
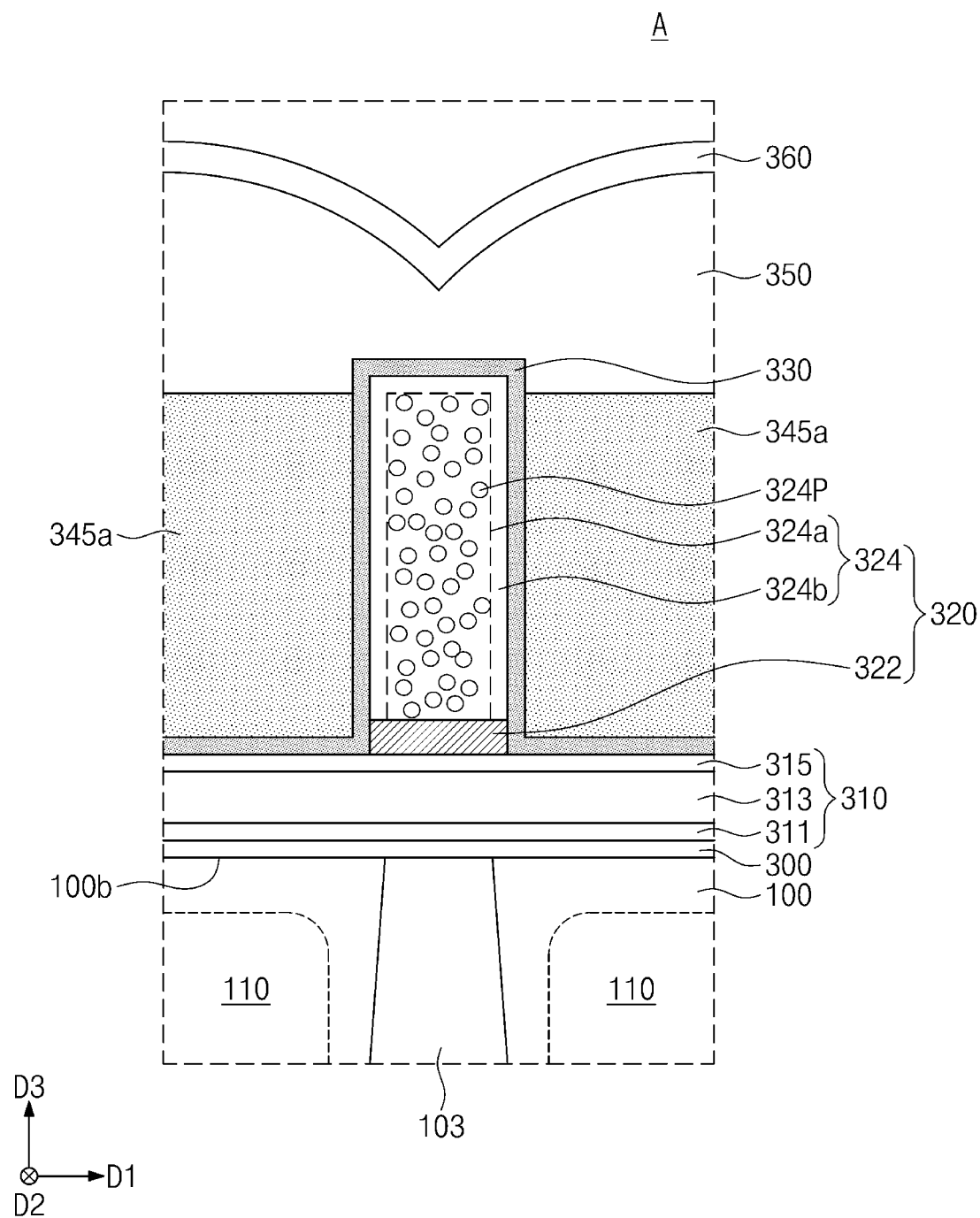

As shown in FIG. 5C, in some exemplary embodiments, the low-refractive index pattern 324 may include the pores 324P provided therein and a plurality of recesses 324R provided at its surface. In an exemplary embodiment, the sizes and shapes of the recesses 324R may be irregular. However, exemplary embodiments of the present inventive concepts are not limited thereto.

Referring again to the exemplary embodiments of FIGS. 4A and 4B, the protective layer 330 may cover a surface of the grid structure 320 on the planarization insulating layer 310 and may have a substantially uniform thickness. For example, the protective layer 330 may have a substantially uniform thickness on a top surface and sidewalls of the grid structure 320. The protective layer 330 may extend from between the sidewalls of the grid structure 320 and sidewalls of the first to third color filters 345a and 345b into between the planarization insulating layer 310 and bottom surfaces of the first to third color filters 345a and 345b.

The protective layer 330 may protect the first to third color filters 345a and 345b from moisture and/or a contaminant permeating into the low-refractive index pattern 324. In an exemplary embodiment, the protective layer 330 may be formed of a hydrophobic material. For example, the protective layer 330 may be a silicon oxide-based insulating layer including impurities. In an exemplary embodiment, the protective layer 330 may include at least one layer comprised of silicon oxide including carbon (C) or nitrogen (N). The protective layer 330 may include a SiOCH layer, a SiOC layer, a SiOF layer, a SiN layer, a SiCN layer, and/or a SiC layer. For example, the protective layer 330 may be a $SiO_xC_{2-x}$ layer or a $SiO_xN_{1-x}$ layer. In an exemplary embodiment, the protective layer 330 may have a thickness in a range of about 10 Å to about 200 Å. Since the protective layer 330 has a relatively small thickness of about 10 Å to about 200 Å, the protective layer 330 may not affect a path of light incident on each of the sub-pixel regions PG1, PG2, PR and PB.

Referring to the exemplary embodiment of FIG. 5A, the protective layer 330 may be spaced apart from the pores 324P existing in the low-refractive index pattern 324 by the buffer region 324b of the low-refractive index pattern 324. Referring to the exemplary embodiment of FIG. 5C, when the recesses 324R are formed in the surface of the low-refractive index pattern 324, the protective layer 330 may fill the recesses 324R of the low-refractive index pattern 324.

Referring again to the exemplary embodiment of FIG. 4B, the first to third color filters 345a and 345b may be disposed in the openings of the grid structure 320, in which the protective layer 330 is formed. In an exemplary embodiment, first color filters 345a may be provided on the first sub-pixel regions PG1, PG2 of the first pixel region P1, respectively, and second color filters 345b may be provided on the second sub-pixel regions PR of the second pixel region P2, respectively. Likewise, third color filters may be provided on the third sub-pixel regions PB of the third pixel region P3, respectively. In an exemplary embodiment, the first to third color filters 345a and 345b may include green, red and blue color filters, respectively. In another exemplary embodiment, the first to third color filters 345a and 345b may include magenta (Mg), yellow (Y) and cyan (Cy) color filters, respectively. However, exemplary embodiments of the present inventive concepts are not limited thereto. Three kinds of the color filters were described as examples. However, in other exemplary embodiments, four or more kinds of color filters may be provided.

In an exemplary embodiment, at least two first color filters 345a may be disposed between the second color filters 345b adjacent to each other. The grid structure 320 may include first fence portions provided between the sub-pixel regions PG1, PG2, PR or PB of each of the pixel regions P1, P2 and P3 in a plan view (e.g., in a plane defined by the first direction D1 and second direction D2), and second fence portions provided between different pixel regions P1, P2 and P3 in a plan view. The first fence portions of the grid structure 320 may be provided between adjacent color filters of the first, second and third color filters 345a or 345b that have the same color, and the second fence portions of the grid structure 320 may be provided between adjacent color filters of the first second and third color filters 345a and 345b that have different colors to each other.

In the above descriptions, the number of the first pixel regions P1 is more than the number of the second or third pixel regions P2 or P3. However, exemplary embodiments of the present inventive concepts are not limited thereto. For example, in another exemplary embodiment, the semiconductor substrate 100 may include first to fourth pixel regions, and color filters corresponding to the first to fourth pixel regions may include red, green, blue and white color filters.

Referring to the exemplary embodiment of FIG. 5A, top surfaces of the first and second color filters 345a and 345b may be substantially coplanar (e.g., in the third direction D3) with a top surface of the protective layer 330 disposed on the top surface of the grid structure 320. The top surface of the third color filter may also be substantially coplanar (e.g., in the third direction D3) with a top surface of the protective layer 330. For example, the top surfaces of the first and second color filters 345a and 345b may be located at substantially the same level (e.g., distance from an upper surface of the semiconductor substrate 100 in the third direction D3) as the top surface of the protective layer 330 disposed on the top surface of the grid structure 320. However, exemplary embodiments of the present inventive concepts are not limited thereto. For example, as shown in the exemplary embodiment of FIG. 5D, top surfaces of the first and second color filters 345a and 345b may be located at a lower level than or substantially the same level as the top surface of the grid structure 320.

A micro lens array 350 may be disposed on a color filter array including the first to third color filters 345a and 345b. The micro lens array 350 may include a flat portion 351 adjacent to the first to third color filters 345a and 345b (e.g., in the third direction D3), and micro lenses 353 provided on the flat portion 351 to correspond to the sub-pixel regions PG1, PG2, PR and PB, respectively. For example, as shown in the exemplary embodiment of FIG. 4B, a bottom surface of the flat portion 351 of the micro lens array 350 may directly contact an upper surface of the protective layer 330 and an upper surface of the first to third color filters 345a and 345b. A lower surface of the micro lens 353 may directly contact an upper surface of the flat portion 351.

In an exemplary embodiment, the first to third color filters 345a and 345b may have substantially flat top surfaces, and thus the flat portion 351 may have a substantially uniform thickness on the top surfaces of the first to third color filters 345a and 345b. The micro lenses 353 may be provided on the sub-pixel regions PG1, PG2, PR and PB, respectively, and may have upward convex shapes. According to an exemplary embodiment of the present inventive concepts, since a dispersion of the thickness of the flat portion 351 in the micro lens array 350 is reduced, a light collecting efficiency through the micro lenses 353 may be improved.

A passivation layer 360 may conformally cover a top surface of the micro lens array 350. In an exemplary embodiment, the passivation layer 360 may be formed of an inorganic oxide. However, exemplary embodiments of the present inventive concepts are not limited thereto.

Hereinafter, the descriptions to the same technical features as in the above exemplary embodiments will be omitted for the purpose of ease and convenience in explanation.

Figure 6A:
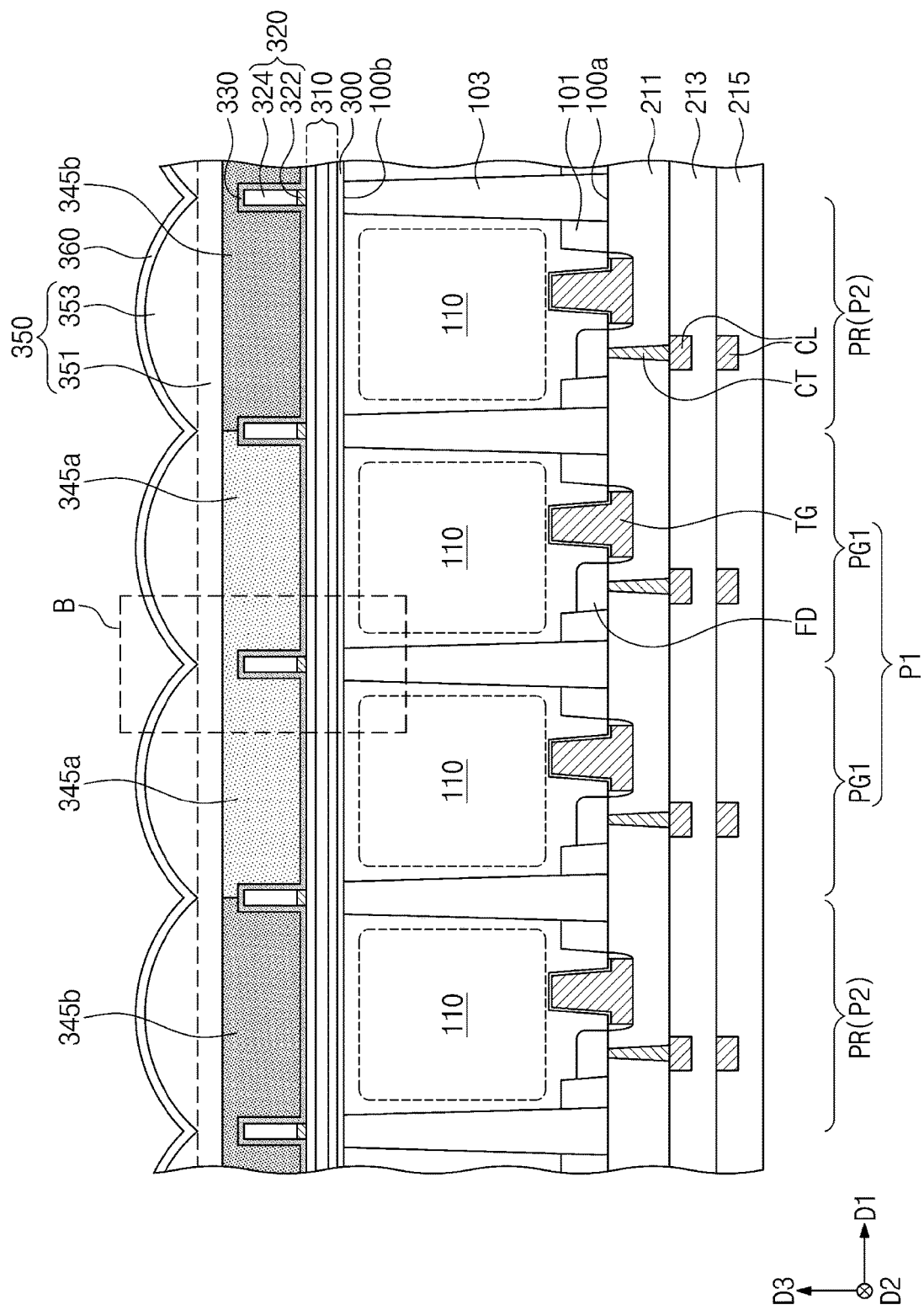
FIG. 6A is a cross-sectional view of an image sensor taken along line I-I' of FIG. 4A according to an exemplary embodiment of the present inventive concepts.
Figure 6B:
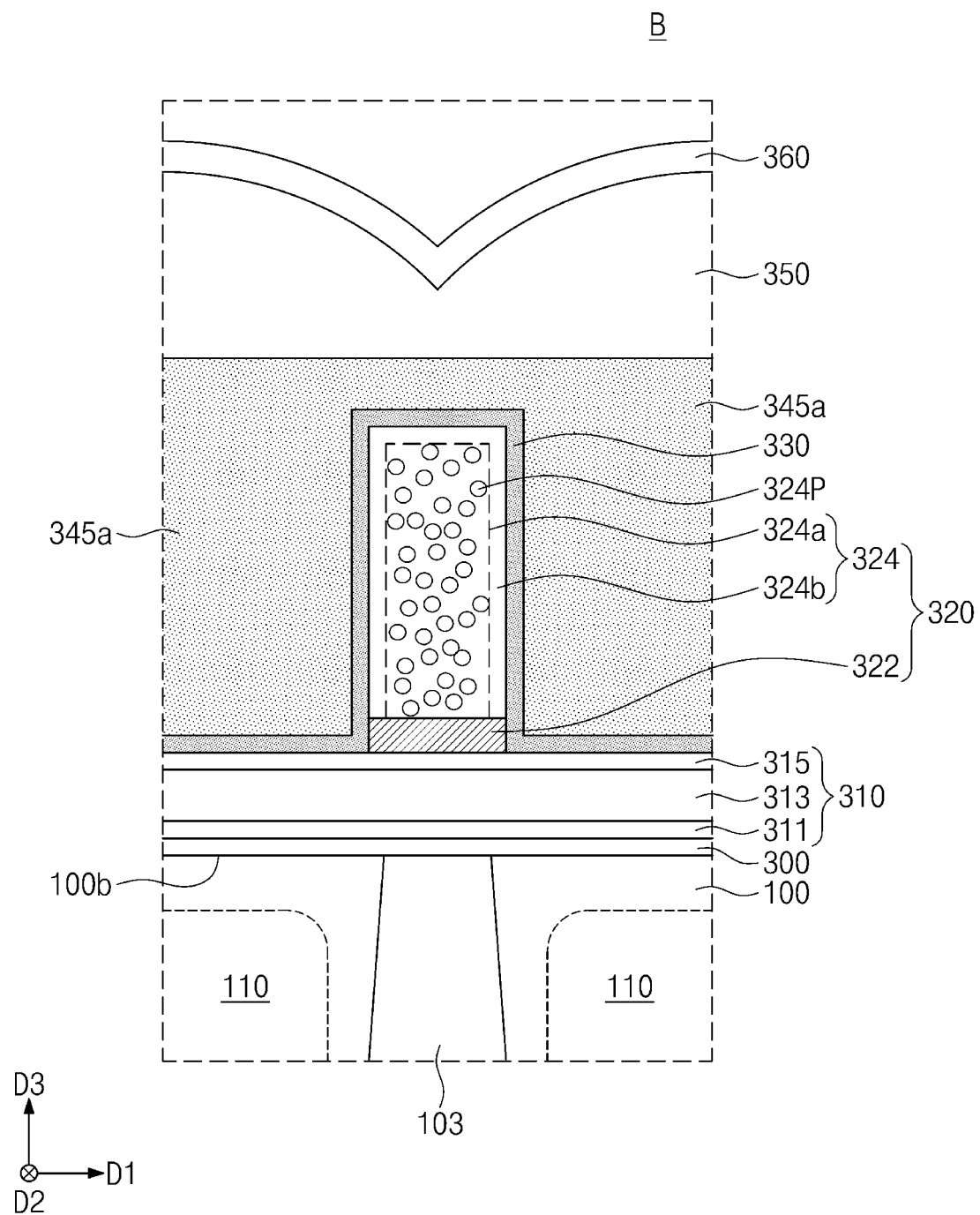
FIG. 6B is an enlarged view of a portion 'B' of FIG. 6A.

FIG. 6A is a cross-sectional view taken along the line I-I' of FIG. 4A to illustrate an image sensor according to an exemplary embodiment of the present inventive concepts. FIG. 6B is an enlarged view of portion B of FIG. 6A according to an exemplary embodiment of the present inventive concepts.

Referring to the exemplary embodiments of FIGS. 6A and 6B, each of first to third color filters 345a, 345b may have a substantially flat top surface, as described above. In addition, the top surfaces of the first to third color filters 345a and 345b may be located at a higher level (e.g., in the third direction D3) than the top surface of the grid structure 320. A height of the grid structure 320 may be less than thicknesses (e.g., length in the third direction D3) of the first to third color filters 345a and 345b. A In an exemplary embodiment, a thickness of each first to third color filter 345a or 345b disposed on the planarization insulating layer 310 may be different from a thickness of each first to third color filter 345a or 345b disposed on the grid structure 320.

The first color filter 345a may be provided on the first pixel region P1. The first color filter 345a may be provided on a plurality of the first sub-pixel regions PG1. Portions of the first color filter 345a, which are provided on the first sub-pixel regions PG1, may be connected to each other on the first fence portion of the grid structure 320 provided between the first sub-pixel regions PG1 in a plan view. For example, the first color filter 345a may cover the top surface of the first fence portion of the grid structure 320 on each of the first sub-pixel regions PG1. In addition, the first color filter 345a provided on the plurality of the first sub-pixel regions PG2 of the first pixel P1, the second color filter 345b provided on the second sub-pixel regions PR of the second pixel P2 and the third color filter provided on the third sub-pixel regions PB of the third pixel P3 may have substantially the same features as the first color filter 345a.

Figure 7A:
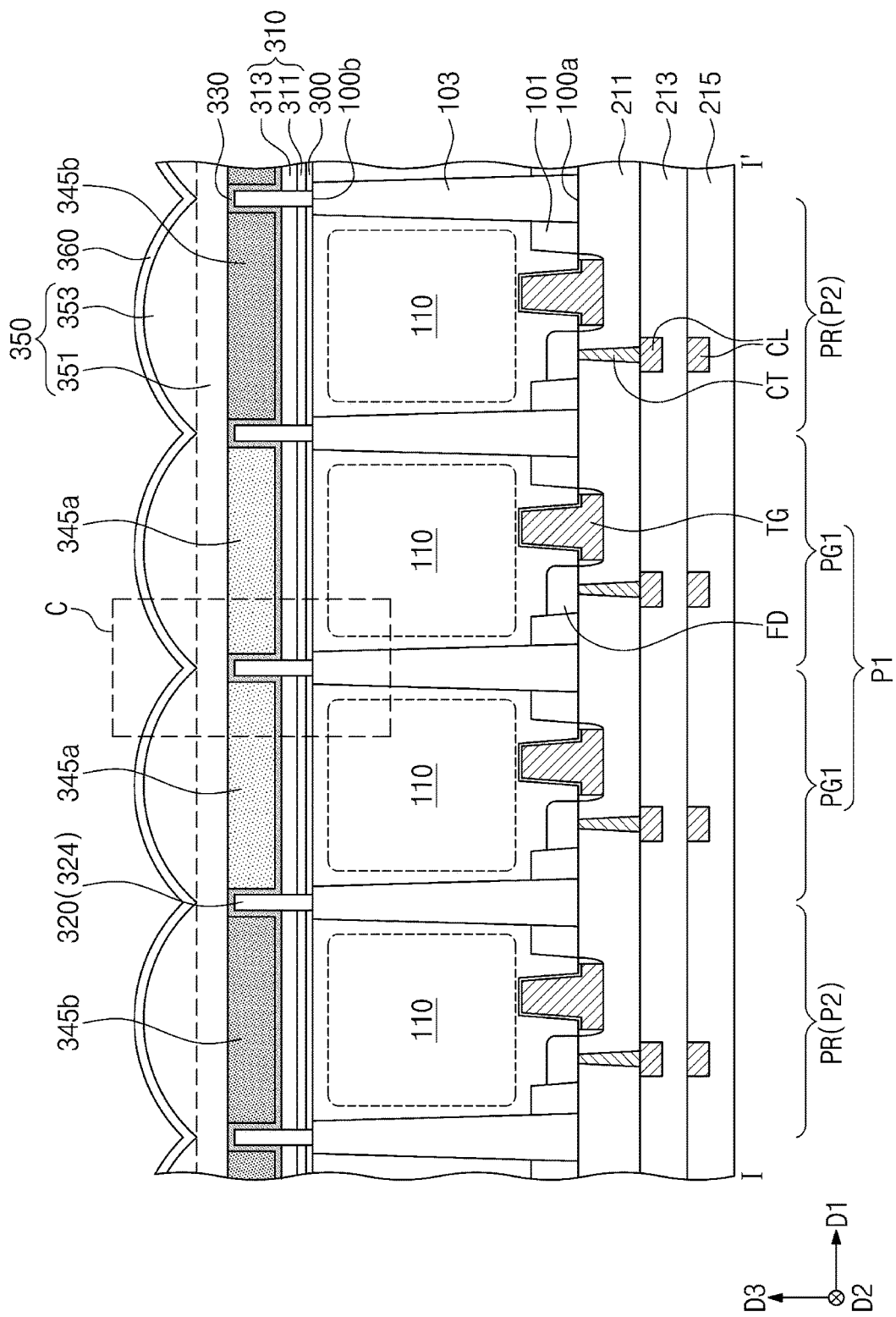
FIG. 7A is a cross-sectional view of an image sensor taken along line I-I' of FIG. 4A according to an exemplary embodiment of the present inventive concepts.
Figure 7B:
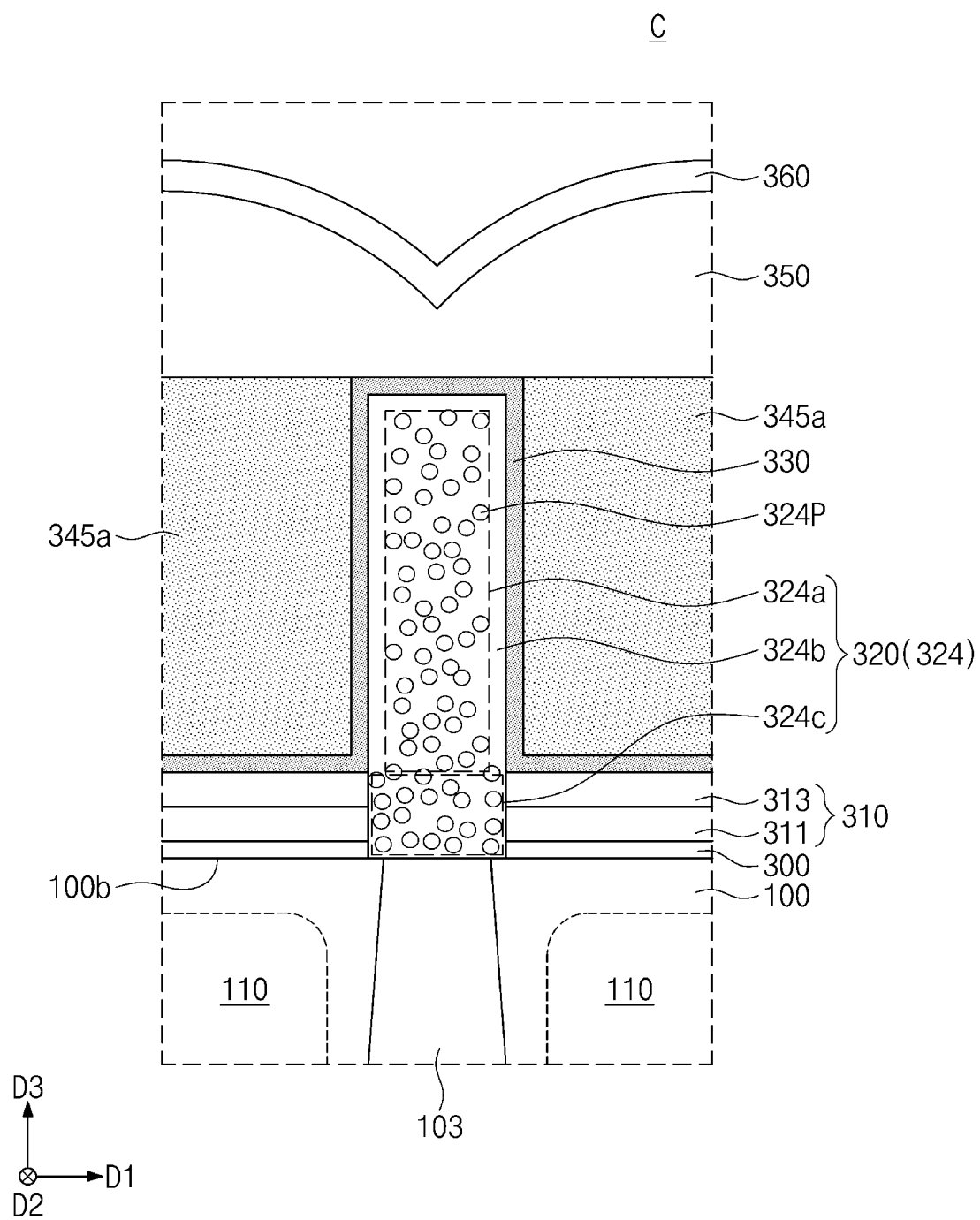
FIG. 7B is an enlarged view of portion C of FIG. 7A according to an exemplary embodiment of the present inventive concepts.

FIG. 7A is a cross-sectional view taken along line I-I' of FIG. 4A to illustrate an image sensor according to an exemplary embodiment of the present inventive concepts. FIG. 7B is an enlarged view of a portion C of FIG. 7A.

Referring to the exemplary embodiment of FIG. 7A, a planarization insulating layer 310 may be disposed on the second surface 100b of the semiconductor substrate 100, and a lower portion of a grid structure 320 may be disposed in the planarization insulating layer 310. For example, the lower portion of the grid structure 320 may penetrate the planarization insulating layer 310 (e.g., in the third direction DR3).

The fixed charge layer 300 may be disposed between the planarization insulating layer 310 and the second surface 100b of the semiconductor substrate 100, and a bottom surface of the grid structure 320 may be in contact with the fixed charge layer 300. Alternatively, as shown in the exemplary embodiment of FIG. 7A, the lower portion of the grid structure 320 may also penetrate the fixed charge layer 300, and the bottom surface of the grid structure 320 may be in direct contact with the pixel isolation structure 103. The planarization insulating layer 310 may include a first planarization layer 311 and a second planarization layer 313, which are sequentially stacked (e.g., in the third direction D3). In contrast with the exemplary embodiment shown in FIG. 5A, the exemplary embodiment of FIG. 7B may not include a third planarization layer 315 disposed on the second planarization layer 313 and the lower surface of the protective layer 330 may be disposed directly on an upper surface of the second planarization layer 313. The first and second planarization layers 311 and 313 may have different refractive indexes and different thicknesses.

The grid structure 320 may include a low-refractive index pattern 324 formed of a material having a refractive index lower than the refractive index of the semiconductor substrate (e.g., silicon) 100. For example, in an exemplary embodiment, the grid structure 320 may be formed of a low-refractive index material having a refractive index of about 1.3 or less.

Referring to the exemplary embodiment of FIG. 7B, the grid structure 320 may include a low-refractive index pattern 324 including pores 324P, as described above. A bottom surface of the low-refractive index pattern 324 may be lower than a top surface of the planarization insulating layer 310. For example, a lower portion of the low-refractive index pattern 324 may be disposed in the planarization insulating layer 310 and may extend through the first planarization layer 311, the second planarization layer 313 and the fixed charge layer 300.

The low-refractive index pattern 324 may include a low-refractive index region 324a including the pores 324P, a buffer region 324b surrounding the low-refractive index region 324a (e.g., surrounding upper and lateral side surfaces of the low-refractive index region 324a). The low-refractive index pattern 324 may be in direct contact with the protective layer 330. The low-refractive index pattern 324 may include a lower region 324c disposed in the planarization insulating layer 310 and including the pores 324P. An upper surface of the lower region 324c may directly contact lower surfaces of the low-refractive index region 324a and the buffer region 324b. A density of the pores 324P in the buffer region 324b may be less than densities of the pores 324P in the low-refractive index region 324a and the lower region 324c. Some of the pores 324P in the lower region 324c of the low-refractive index pattern 324 may be in contact with the planarization insulating layer 310.

Figure 8B:
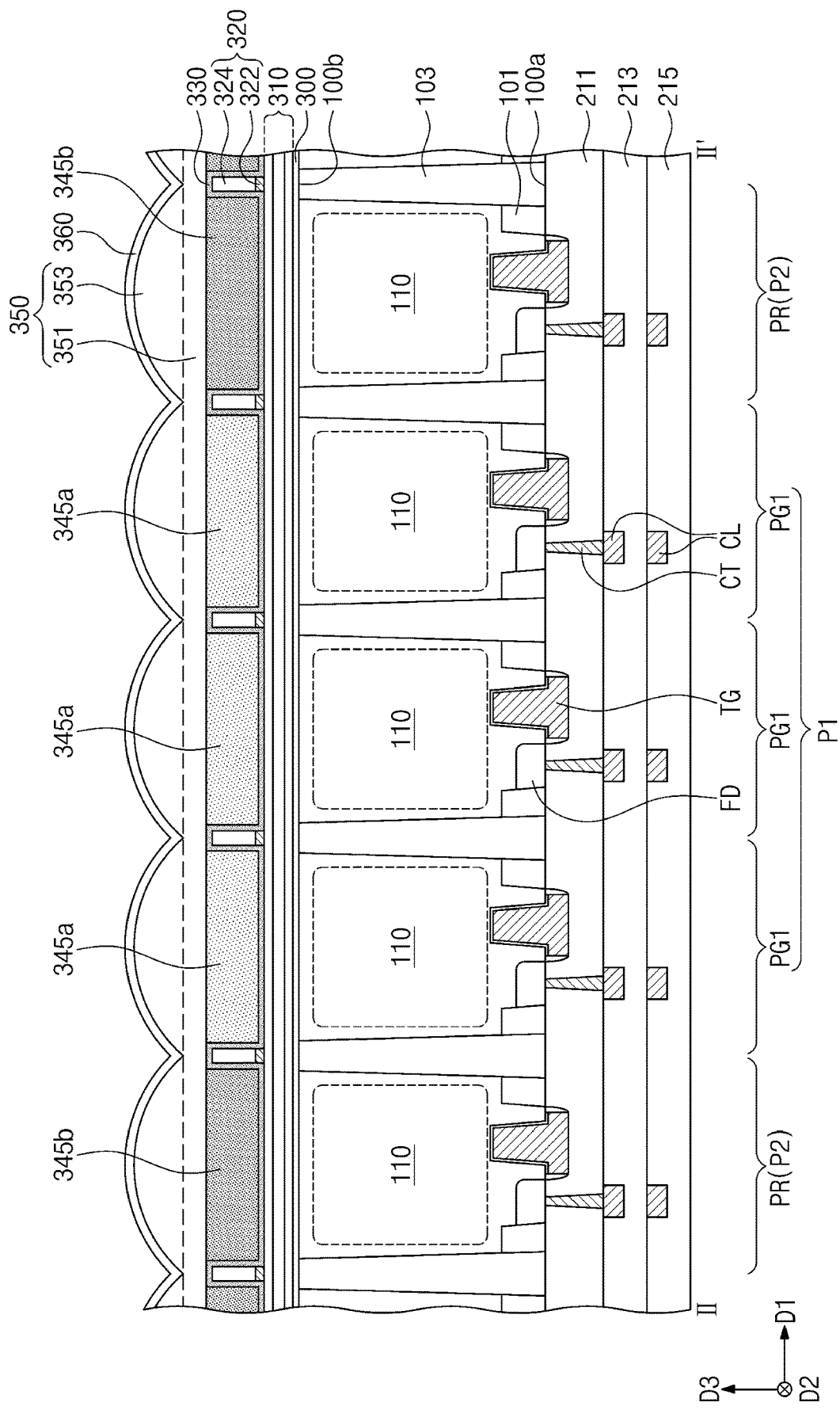
FIG. 8B is a cross-sectional view of an image sensor taken along a line II-II' of FIG. 8A according to an exemplary embodiment of the present inventive concepts.

FIG. 8A is a plan view illustrating an image sensor according to an exemplary embodiment of the present inventive concepts. FIG. 8B is a cross-sectional view taken along a line II-II' of FIG. 8A to illustrate an image sensor according to an exemplary embodiment of the present inventive concepts.

Referring to the exemplary embodiments of FIGS. 8A and 8B, each of the first to third pixel regions P1, P2 and P3 described above with reference to the exemplary embodiment of FIG. 3 may include sub-pixel regions including first sub-pixel regions PG1, PG2, second sub-pixel regions PR and third sub-pixel regions PB arranged in a 3×3 matrix form. For example, at least three first sub-pixel regions PG1, PG2 may be disposed between the second sub-pixel regions PR adjacent to each other. Likewise, at least three second sub-pixel regions PR may be disposed between two adjacent first sub-pixel regions PG1, PG2. As shown in the exemplary embodiment of FIG. 5A, the three first sub-pixel regions PG1, PG2 adjacent to the two second sub-pixel regions may be one of PG1 or PG2. For example, the first sub-pixel regions PG1 may be disposed between adjacent second sub-pixel regions PR (e.g., in the first direction D1) and the first sub-pixel regions PG2 may be disposed between adjacent third sub-pixel regions PB.

The grid structure 320 may include first fence portions provided between the first, second and third sub-pixel regions PG1, P02, PR and PB in a plan view (e.g., in a plane defined by the first direction D1 and the second direction D2), and second fence portions provided between the pixel regions P1, P2 and P3 in a plan view. In this exemplary embodiment, at least two first fence portions may be disposed between the second fence portions spaced apart from each other.

As described above, the grid structure 320 may include the low-refractive index pattern 324, and the protective layer 330 may conformally cover the surface of the low-refractive index pattern 324. In addition, the first to third color filters 345a and 345b may fill the openings defined by the grid structure 320.

Figure 9:
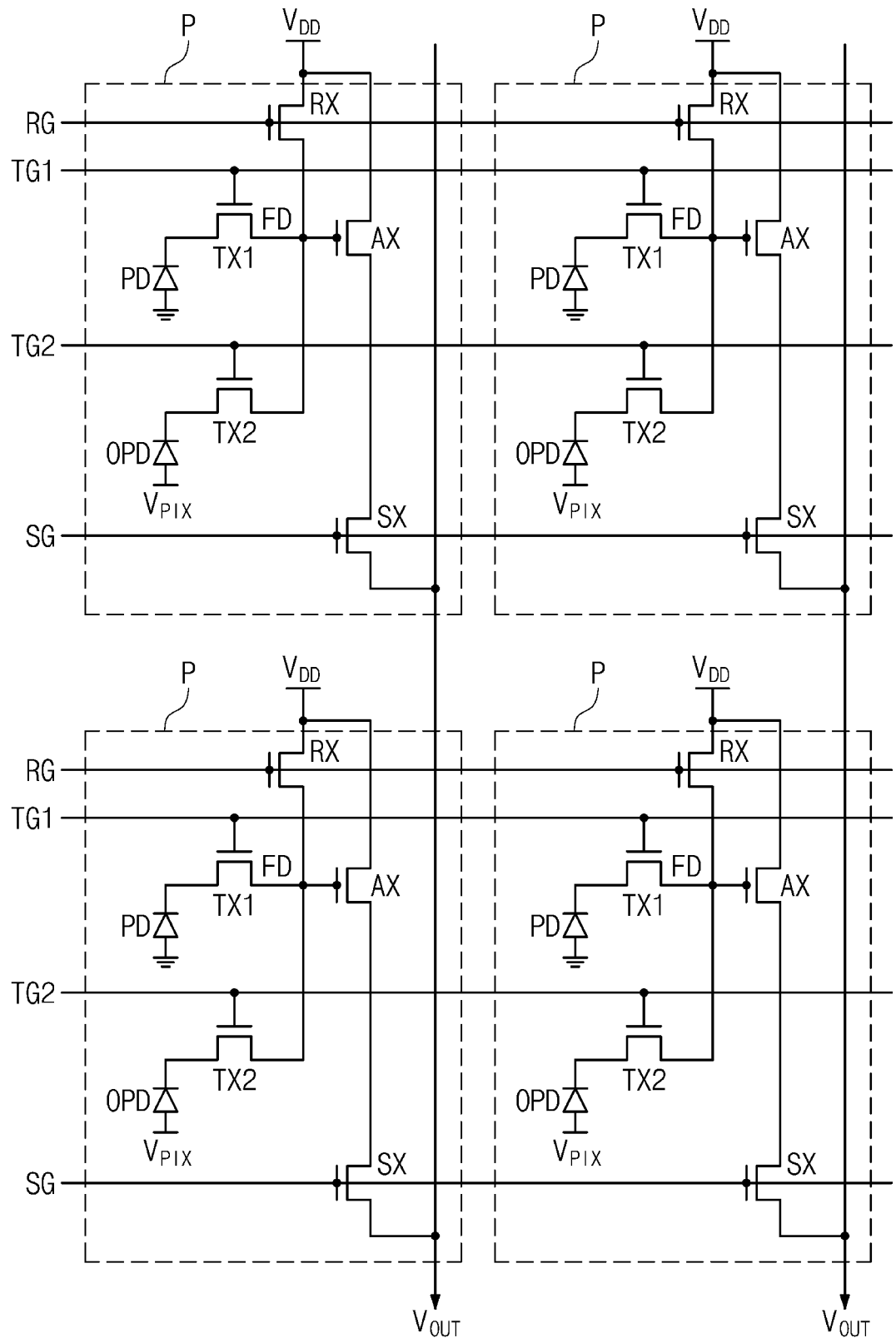
FIG. 9 is a circuit diagram illustrating an active pixel sensor array of an image sensor according to an exemplary embodiment of the present inventive concepts.

FIG. 9 is a circuit diagram illustrating an active pixel sensor array of an image sensor according to an exemplary embodiment of the present inventive concepts.

Referring to the exemplary embodiment of FIG. 9, each of the unit pixels P may include a photoelectric conversion element PD, an organic photoelectric conversion element OPD, first and second transfer transistors TX1 and TX2, and readout transistors that include reset, amplifying and selection transistors RX, AX and SX described with reference to the exemplary embodiment of FIG. 2A.

The first transfer transistor TX1 may be connected to the photoelectric conversion element PD, and the second transfer transistor TX2 may be connected to the organic photoelectric conversion element OPD. The first and second transfer transistors TX1 and TX2 may share a charge detection node (e.g., a floating diffusion region) FD.

The photoelectric conversion element PD and the organic photoelectric conversion element OPD may generate photocharges (or charges) in proportion to the amount of light incident from the outside and may accumulate the generated photocharges. In an exemplary embodiment, the photoelectric conversion element PD may include a photodiode, a photo transistor, a photo gate, a pinned photodiode (PPD), or any combination thereof. The organic photoelectric conversion element OPD may include an organic photoelectric conversion layer. The organic photoelectric conversion layer may generate photocharges (electron-hole pairs) in proportion to the amount of incident light of a specific wavelength band. The photocharges generated from the organic photoelectric conversion layer may be stored in the charge detection node FD by a difference between voltages applied to both ends of the organic photoelectric conversion element OPD.

The first and second transfer transistors TX1 and TX2 may transfer charges accumulated in the photoelectric conversion element PD and the organic photoelectric conversion element OPD into the charge detection node FD. The first and second transfer transistors TX1 and TX2 may be controlled by charge transfer signals provided through first and second charge transfer lines. Depending on the charge transfer signals applied to the first and second transfer transistors TX1 and TX2, the charges may be transferred from one of the photoelectric conversion element PD and the organic photoelectric conversion element OPD into the charge detection node FD.

Figure 10:
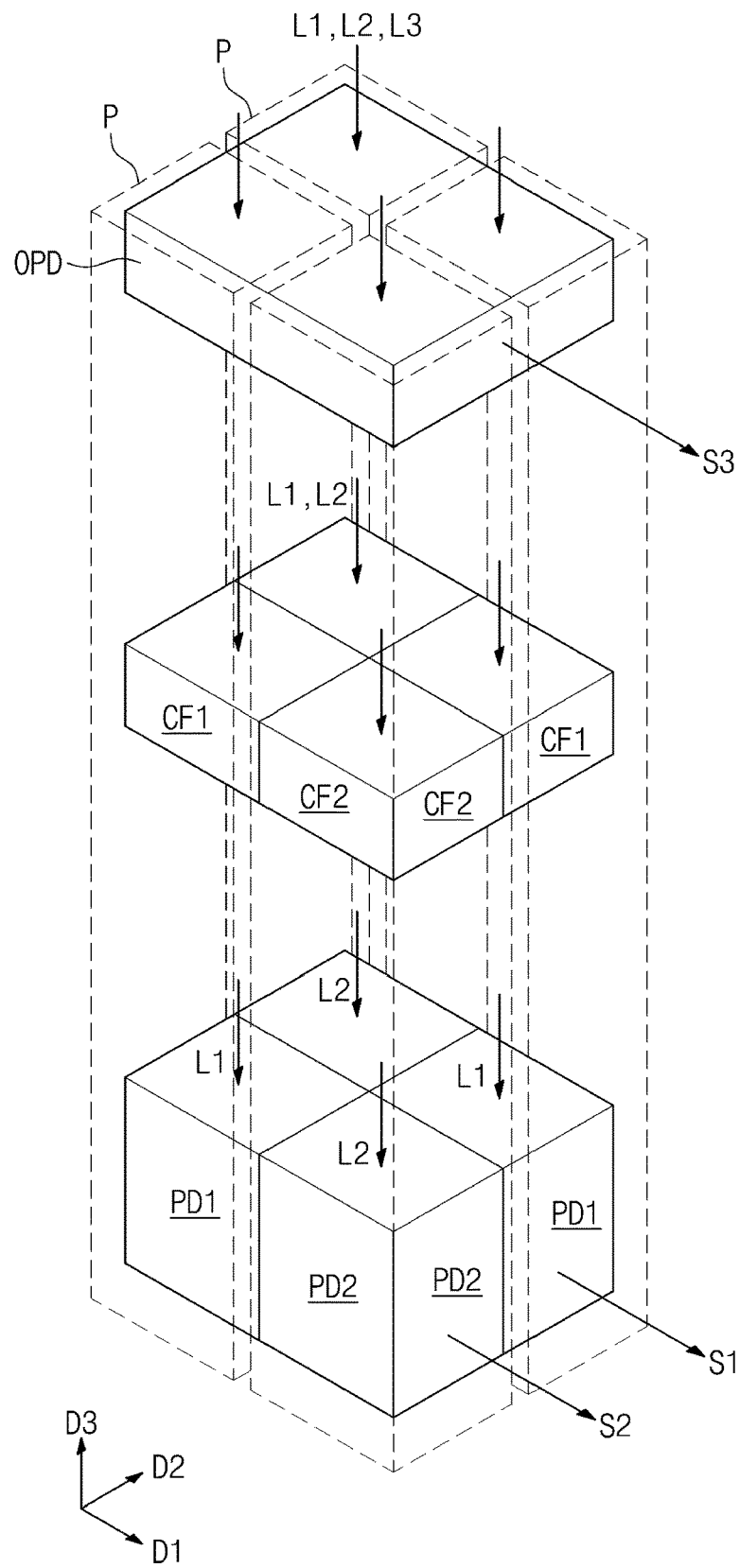
FIG. 10 is an exploded view illustrating an image sensor according to an exemplary embodiment of the present inventive concepts.

FIG. 10 is an exploded view illustrating an image sensor according to an exemplary embodiment of the present inventive concepts.

Referring to the exemplary embodiment of FIG. 10, an image sensor may include a plurality of unit pixels P two-dimensionally arranged in the first direction D1 and the second direction D2. Each of the unit pixels P of the image sensor may include at least two photoelectric conversion elements stacked in the third direction D3. Each of the unit pixels P may include a first or second photoelectric conversion element PD1 or PD2, a first or second color filter CF1 or CF2, and an organic photoelectric conversion element OPD.

The first and second photoelectric conversion elements PD1 and PD2 may be provided in a semiconductor substrate and may be arranged in a matrix form. The first and second photoelectric conversion elements PD1 and PD2 may be alternately and repeatedly arranged in the first direction D1 and may be alternately and repeatedly arranged in the second direction D2.

The organic photoelectric conversion elements OPD may be stacked on the first and second photoelectric conversion elements PD1 and PD2, respectively. For example, the organic photoelectric conversion elements OPD may overlap with the first and second photoelectric conversion elements PD1 and PD2 (e.g., in the third direction D3). The first color filters CF1 may be provided between the first photoelectric conversion elements PD1 and the organic photoelectric conversion elements OPD, respectively, in the third direction D3, and the second color filters CF2 may be provided between the second photoelectric conversion elements PD2 and the organic photoelectric conversion elements OPD, respectively, in the third direction D3.

In an exemplary embodiment, incident lights L1, L2 and L3 of first to third wavelength bands may be inputted into the organic photoelectric conversion elements OPD of the unit pixels P. Lights of different wavelength bands may be incident on the first and second photoelectric conversion elements PD1 and PD2 and the organic photoelectric conversion element OPD, respectively. The first and second photoelectric conversion elements PD1 and PD2 and the organic photoelectric conversion element OPD may generate photocharges in proportion to the intensities of the incident lights L1, L2 and L3.

The first photoelectric conversion element PD1 may generate first photocharges corresponding to the incident light L1 of the first wavelength band. The second photoelectric conversion element PD2 may generate second photocharges corresponding to the incident light L2 of the second wavelength band. The organic photoelectric conversion element OPD may generate third photocharges corresponding to the incident light L3 of the third wavelength band. In this exemplary embodiment, the first wavelength band may be longer than the third wavelength band, and the second wavelength band may be shorter than the third wavelength band. For example, in an exemplary embodiment, the incident light L1 of the first wavelength band may be red light, the incident light L2 of the second wavelength band may be blue light, and the incident light L3 of the third wavelength band may be green light.

The incident light L1 of the first wavelength band may pass through the organic photoelectric conversion element OPD and the first color filter CF1 and then may be incident on the first photoelectric conversion element PD1. The incident light L2 of the second wavelength band may pass through the organic photoelectric conversion element OPD and the second color filter CF2 and then may be incident on the second photoelectric conversion element PD2. The incident light L3 of the third wavelength band may be incident on the organic photoelectric conversion element OPD.

A first pixel signal S1 corresponding to the incident light L1 of the first wavelength band may be outputted from the unit pixel P including the first photoelectric conversion element PD1, and a second pixel signal S2 corresponding to the incident light L2 of the second wavelength band may be outputted from the unit pixel P including the second photoelectric conversion element PD2. In addition, a third pixel signal S3 corresponding to the incident light L3 of the third wavelength band may be outputted from the organic photoelectric conversion elements OPD of the unit pixels P. For example, the first photoelectric conversion element PD1 may generate photocharges corresponding to red light. The second photoelectric conversion element PD2 may generate photocharges corresponding to blue light. The organic photoelectric conversion element OPD may generate photocharges corresponding to green light.

Figure 11:
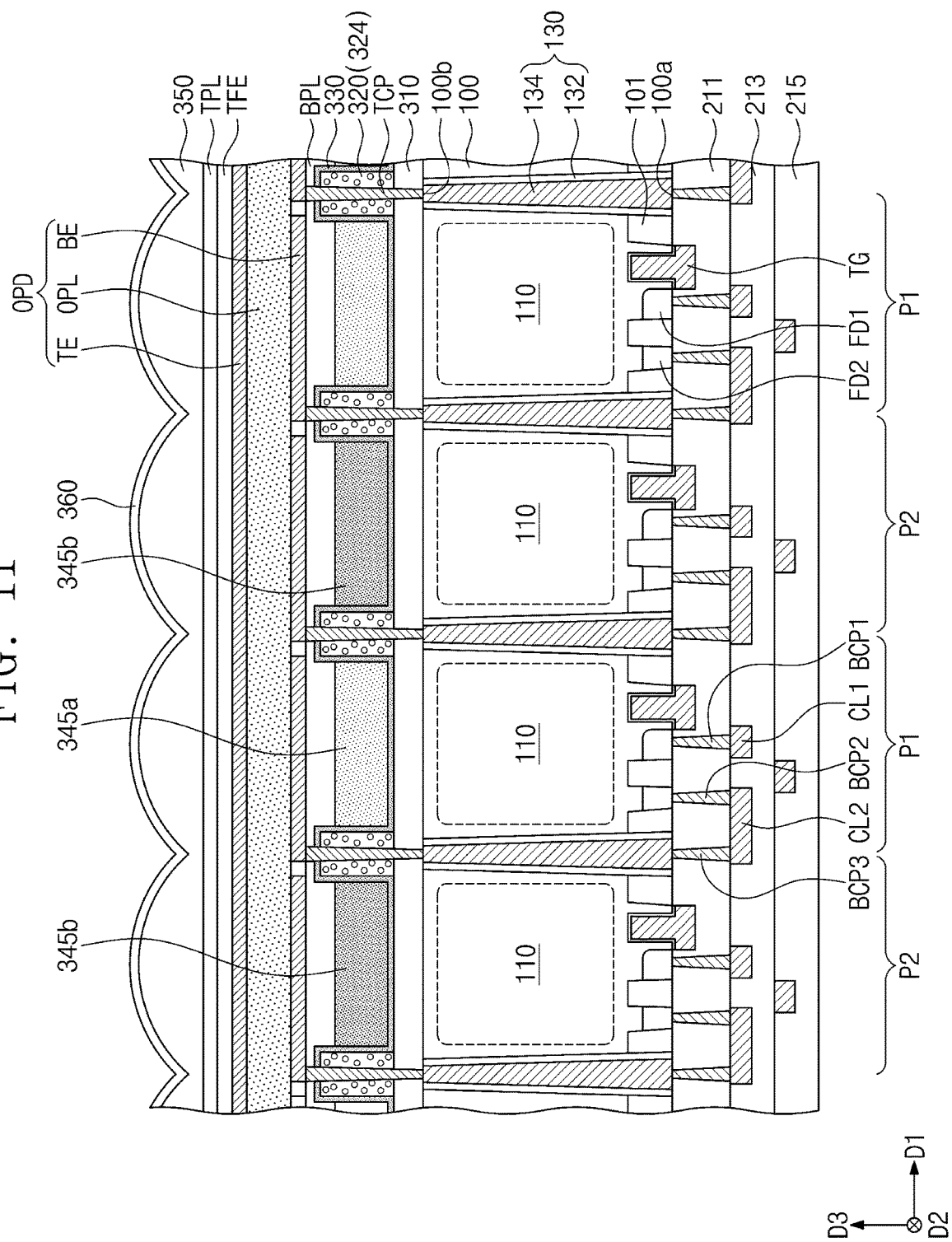
FIG. 11 is a cross-sectional view illustrating an image sensor according to an exemplary embodiment of the present inventive concepts.

FIG. 11 is a cross-sectional view illustrating an image sensor according to an exemplary embodiment of the present inventive concepts.

Referring to the exemplary embodiment of FIG. 11, a pixel isolation structure defining pixel regions P1 and P2 and photoelectric conversion regions 110 may be provided in a semiconductor substrate 100, as described above.

In each of the pixel regions P1 and P2, a transfer gate electrode TG may be disposed on the first surface 100a of the semiconductor substrate 100, and a first floating diffusion region FD1 may be provided in the semiconductor substrate 100 at a side of the transfer gate electrode TG. A second floating diffusion region FD2 may be provided in the semiconductor substrate 100 and may be spaced apart from the first floating diffusion region FD1 (e.g., in the first direction D1) with a device isolation layer 101 therebetween.

The first and second floating diffusion regions FD1 and FD2 may be formed by ion-implanting dopants of which a conductivity type is opposite to that of the semiconductor substrate 100. For example, the first and second floating diffusion regions FD1 and FD2 may be N-type dopant regions.

A through-electrode structure 130 may penetrate a portion of the pixel isolation structure between the pixel regions P1 and P2. The through-electrode structure 130 may include a through-electrode 134 vertically penetrating the semiconductor substrate 100 (e.g., in the third direction D3), and a through insulating pattern 132 surrounding a sidewall of the through-electrode 134. The through-electrode 134 may include a conductive material. In an exemplary embodiment, the through-electrode 134 may include at least one of poly-silicon doped with N-type or P-type dopants, or a metal material. A width of the through-electrode 134 (e.g., length in the first direction D1) may taper and become progressively smaller from the first surface 100a towards the second surface 100b of the semiconductor substrate 100. For example, the through insulating pattern 132 may include at least one compound selected from silicon oxide, silicon nitride, and silicon oxynitride.

First to third interlayer insulating layers 211, 213 and 215 may be stacked on the first surface 100a of the semiconductor substrate 100. While the exemplary embodiment of FIG. 11 includes three interlayer insulating layers, in other exemplary embodiments, the number of interlayer insulating layers may vary. The first to third interlayer insulating layers 211, 213 and 215 may cover MOS transistors of readout circuits and the transfer gate electrodes TG. A plurality of first to third bottom contact plugs BCP1 to BCP3 may be disposed in at least one of the first to third interlayer insulating layers 211, 213 and 215. For example, as shown in the exemplary embodiment of FIG. 11, the first to third bottom contact plugs PCP1 to BCP3 may be disposed on the first interlayer insulating layer 211. A first bottom contact plug BCP1 may be connected to the first floating diffusion region FD1, and a second bottom contact plug BCP2 may be connected to the second floating diffusion region FD2. A third bottom contact plug BCP3 may be connected to the through-electrode 134.

In an exemplary embodiment, the first bottom contact plug BCP1 may be electrically connected to the reset transistor RX (see FIG. 9) and the amplifying transistor AX (see FIG. 9) through a first connection line CL1. The second bottom contact plug BCP2 may be electrically connected to the third bottom contact plug BCP3 through a second connection line CL2. For example, the through-electrode 134 may be electrically connected to the second floating diffusion region FD2 through the second and third bottom contact plugs BCP2 and BCP3 and the second connection line CL2.

A planarization insulating layer 310 may be disposed on the second surface 100b of the semiconductor substrate 100. The planarization insulating layer 310 may include a single layer or a multi-layer as described above. In an exemplary embodiment, the planarization insulating layer 310 may include a metal oxide such as aluminum oxide and/or hafnium oxide. However, exemplary embodiments of thee present inventive concepts are not limited thereto.

First and second color filters 345a and 345b may be disposed on the planarization insulating layer 310 to correspond to the pixel regions P1 and P2, respectively. The first color filters 345a may be disposed on the first pixel regions P1 and second color filters 345b may be disposed on the second pixel regions P2.

The first and second color filters 345a and 345b may be disposed in openings of a grid structure 320, in which a protective layer 330 is formed. The grid structure 320 may include a low-refractive index pattern 324 including pores, as described above. In addition, the protective layer 330 may have a substantially uniform thickness and may cover a surface of the grid structure 320. A lower surface of the low-refractive index pattern 324 may directly contact an upper surface of the planarization insulating layer 310.

The first color filters 345a may be disposed on the first pixel regions P1, respectively, and the second color filters 345b may be disposed on the second pixel regions P2, respectively. Top surfaces of the first and second color filters 345a and 345b may be located at a lower level than or substantially the same level as a top surface of the grid structure 320. For example, as shown in the exemplary embodiment of FIG. 11, the top surfaces of the first and second color filters 345a and 345b may be lower than the top surface of the grid structure 320.

A first upper planarization layer BPL may cover the top surfaces of the first and second color filters 345a and 345b. The first upper planarization layer BPL may be formed on the flat top surfaces of the first and second color filters 345a and 345b and may have a substantially flat top surface.

Top contact plugs TCP may penetrate the first upper planarization layer BPL, portions of the grid structure 320 and the planarization insulating layer 310 (e.g., in the third direction D3) so as to be connected to the through-electrodes 134, respectively. For example, as shown in the exemplary embodiment of FIG. 11, lower surfaces of the top contact plugs TCP may directly contact upper surfaces of the through-electrode 134. In an exemplary embodiment, each of the top contact plugs TCP may include a barrier metal layer formed of a metal nitride such as at least one compound selected from titanium nitride, tantalum nitride and tungsten nitride, and a metal layer formed of a metal material such as at least one compound selected from tungsten and copper.

An organic photoelectric conversion element OPD may be provided on the first upper planarization layer BPL provided on the second surface 100b of the semiconductor substrate 100. The organic photoelectric conversion element OPD may include bottom and top electrodes BE and TE and an organic photoelectric conversion layer OPL between the bottom and top electrodes BE and TE (e.g., in the third direction D3).

The bottom electrodes BE may be disposed on the first upper planarization layer BPL having the flat top surface. For example, as shown in the exemplary embodiment of FIG. 11, a lower surface of the bottom electrode BE may directly contact and upper surface of the first upper planarization layer BPL. The bottom electrodes BE may respectively correspond to the pixel regions P1 and P2 in a plan view (e.g., in a plane defined by the first direction D1 and the second direction D2) and may be spaced apart from each other (e.g., in the first direction D1 and the second direction D2). Each of the bottom electrodes BE may be electrically connected to the second floating diffusion region FD2 through the top contact plug TCP, the through-electrode 134, the second and third bottom contact plugs BCP2 and BCP3, and the second connection line CL2.

The bottom electrodes BE may include a transparent conductive material. For example, in an exemplary embodiment, the bottom electrodes BE may include at least one compound selected from indium tin oxide (ITO), indium zinc oxide (IZO), zinc oxide (ZnO), $SnO_2$, antimony-doped tin oxide (ATO), aluminum-doped zinc oxide (AZO), gallium-doped zinc oxide (GZO), $TiO_2$, and fluorine-doped tin oxide (FTO).

The organic photoelectric conversion layer OPL may be disposed on the bottom electrodes BE. The organic photoelectric conversion layer OPL may selectively absorb light of a specific wavelength band and may convert the absorbed light into an electrical signal. The organic photoelectric conversion layer OPL may include a P-type organic semiconductor material and an N-type organic semiconductor material, which form a PN junction. In an exemplary embodiment, the organic photoelectric conversion layer OPL may include quantum dots or a chalcogenide.

The top electrode TE may be provided on the organic photoelectric conversion layer OPL. The top electrode TE may include a transparent conductive material and may cover all of the pixel regions P1 and P2.

An encapsulation layer TFE may be disposed on the top electrode TE. The encapsulation layer TFE may be formed of a single layer or a multi-layer. For example, in an exemplary embodiment, the encapsulation layer TFE may include an aluminum oxide layer and/or a silicon oxynitride layer. A second upper planarization layer TPL may be disposed on the encapsulation layer TFE, and a micro lens array 350 may be disposed on the second upper planarization layer TPL. The second upper planarization layer TPL may be formed of a transparent insulating material and may include, for example, a metal oxide or silicon oxide. The micro lens array 350 may include micro lenses 353 corresponding to the pixel regions P1 and P2, respectively.

<Manufacturing Method>

FIGS. 12 to 16, 18 and 19 are cross-sectional views taken along the line I-I' of FIG. 4A to illustrate a method for manufacturing an image sensor according to exemplary embodiments of the present inventive concepts. FIGS. 17A and 17B are enlarged views of portion of FIG. 16 to illustrate a method for manufacturing an image sensor according to exemplary embodiments of the present inventive concepts.

Figure 12:
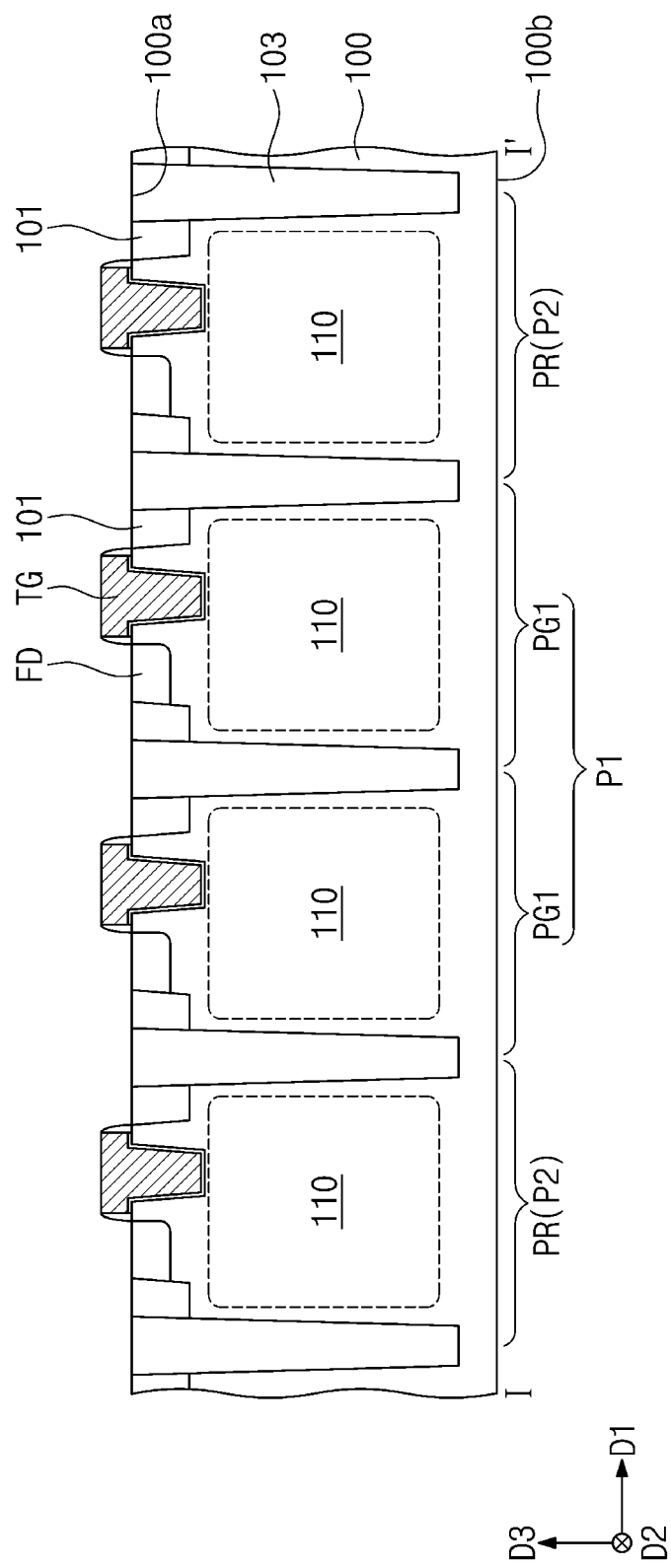
FIGS. 12 to 16, 18 and 19 are cross-sectional views taken along the line I-I' of FIG. 4A illustrating a method for manufacturing an image sensor according to exemplary embodiments of the present inventive concepts.

Referring to FIGS. 4A and 12, a semiconductor substrate 100 having a first conductivity type (e.g., a P-type) may be provided. The semiconductor substrate 100 may have a first surface 100a and a second surface 100b which are opposite to each other (e.g., in the third direction D3).

In an exemplary embodiment, the semiconductor substrate 100 may include first, second and third pixel regions P1, P2 and P3 (see FIG. 3), and each of the first to third pixel regions P1, P2 and P3 (see FIG. 3) may include a plurality of first to third sub-pixel regions PG1, PG2, PR or PB.

Photoelectric conversion regions 110 may be formed in the semiconductor substrate 100. The photoelectric conversion regions 110 may be formed in the first to third sub-pixel regions PG1, PG2, PR or PB, respectively, and may be formed by injecting dopants having a second conductivity type (e.g., an N-type) that is different from the first conductivity type into the semiconductor substrate 100.

A device isolation layer 101 may be formed in the semiconductor substrate 100. The device isolation layer 101 may be adjacent to the first surface 100a of the semiconductor substrate 100 and may define active portions in the first to third sub-pixel regions PG1, PG2, PR and PB. In an exemplary embodiment, a patterning process may be performed on the first surface 100a of the semiconductor substrate 100 to form a shallow trench and the device isolation layer 101 may then be formed by filling the shallow trench with an insulating material. The device isolation layer 101 may be formed before or after the formation of the photoelectric conversion regions 110.

A pixel isolation structure 103 defining the first to third sub-pixel regions PG1, PG2, PR and PB may be formed in the semiconductor substrate 100. In an exemplary embodiment, the first surface 100a and/or the second surface 100b of the semiconductor substrate 100 may be patterned to form a deep trench, and the pixel isolation structure 103 may then be formed by filling the deep trench with an insulating material. However, exemplary embodiments of the present inventive concepts are not limited thereto.

MOS transistors constituting readout circuits may be formed on the first surface 100a of the semiconductor substrate 100. For example, transfer gate electrodes TG may be formed on the first surface 100a of the semiconductor substrate 100 with a gate insulating layer interposed therebetween. Gate electrodes of readout transistors may be formed together when the transfer gate electrodes TG are formed.

After the formation of the transfer gate electrodes TG, a floating diffusion region FD may be formed in the semiconductor substrate 100 at a lateral side of each of the transfer gate electrodes TG (e.g., in the first direction D1). In an exemplary embodiment, the floating diffusion regions FD may be formed by ion-implanting dopants of the second conductivity type. In addition, source/drain dopant regions of the readout transistors may be formed together when the floating diffusion regions FD are formed.

Figure 13:
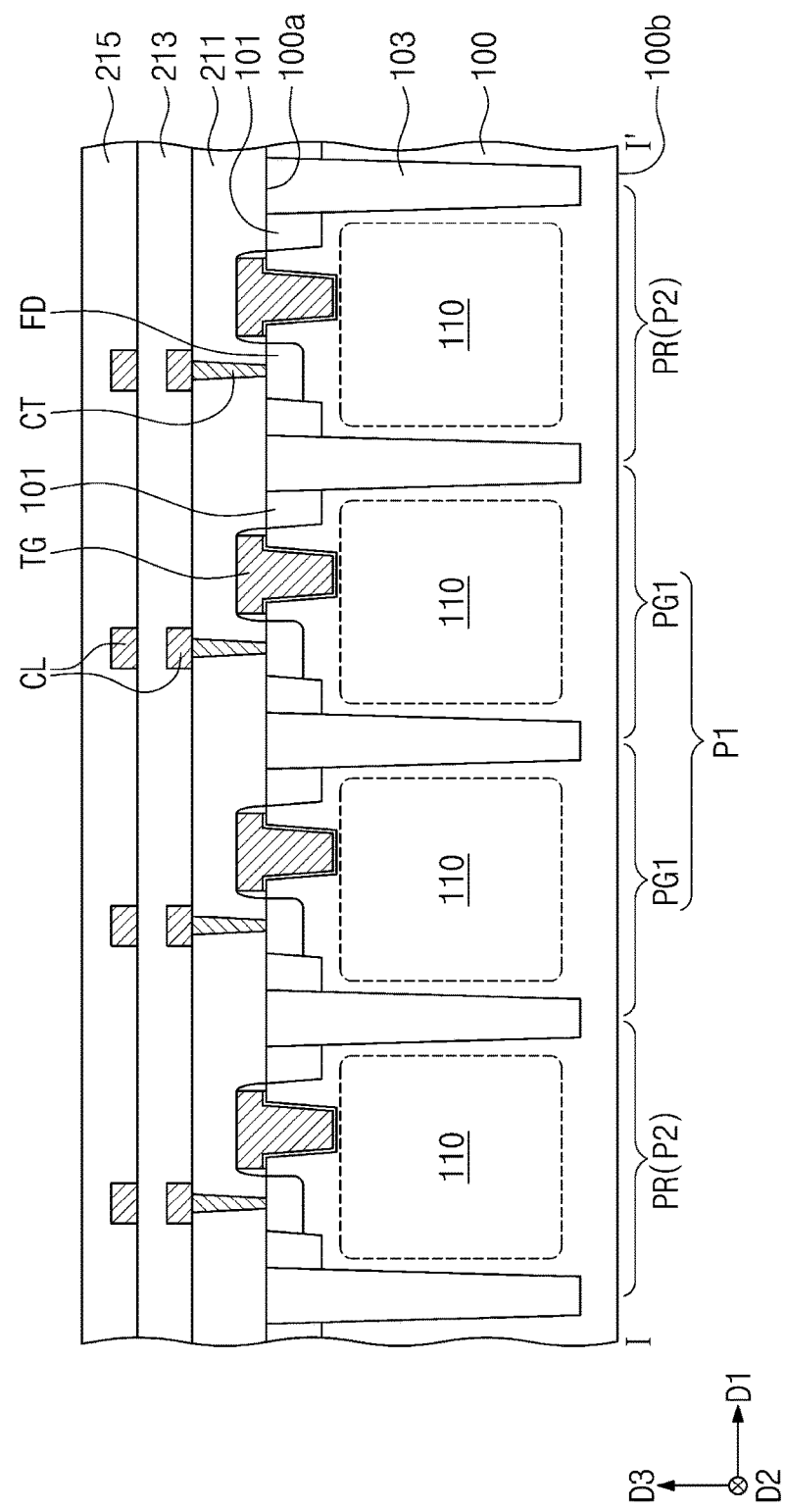

Referring to the exemplary embodiments of FIGS. 4A and 13, first to third interlayer insulating layers 211, 213 and 215, contact plugs CT and connection lines CL may be formed on the first surface 100a of the semiconductor substrate 100. The first to third interlayer insulating layers 211, 213 and 215 may cover the transfer transistors and the readout (or logic) transistors. The first to third interlayer insulating layers 211, 213 and 215 may be formed of a material having an excellent gap-fill property and may be formed in such a way that upper portions thereof are planarized.

The contact plugs CT may be formed in the first to third interlayer insulating layers 211, 213 and 215 and may be connected to the floating diffusion regions FD and/or the readout transistors. The connection lines CL may be formed between the first to third interlayer insulating layers 211, 213 and 215. For example, in an exemplary embodiment, the contact plugs CT and the connection lines CL may be formed of at least one compound selected from copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (WN), or an alloy of a combination thereof.

Figure 14:
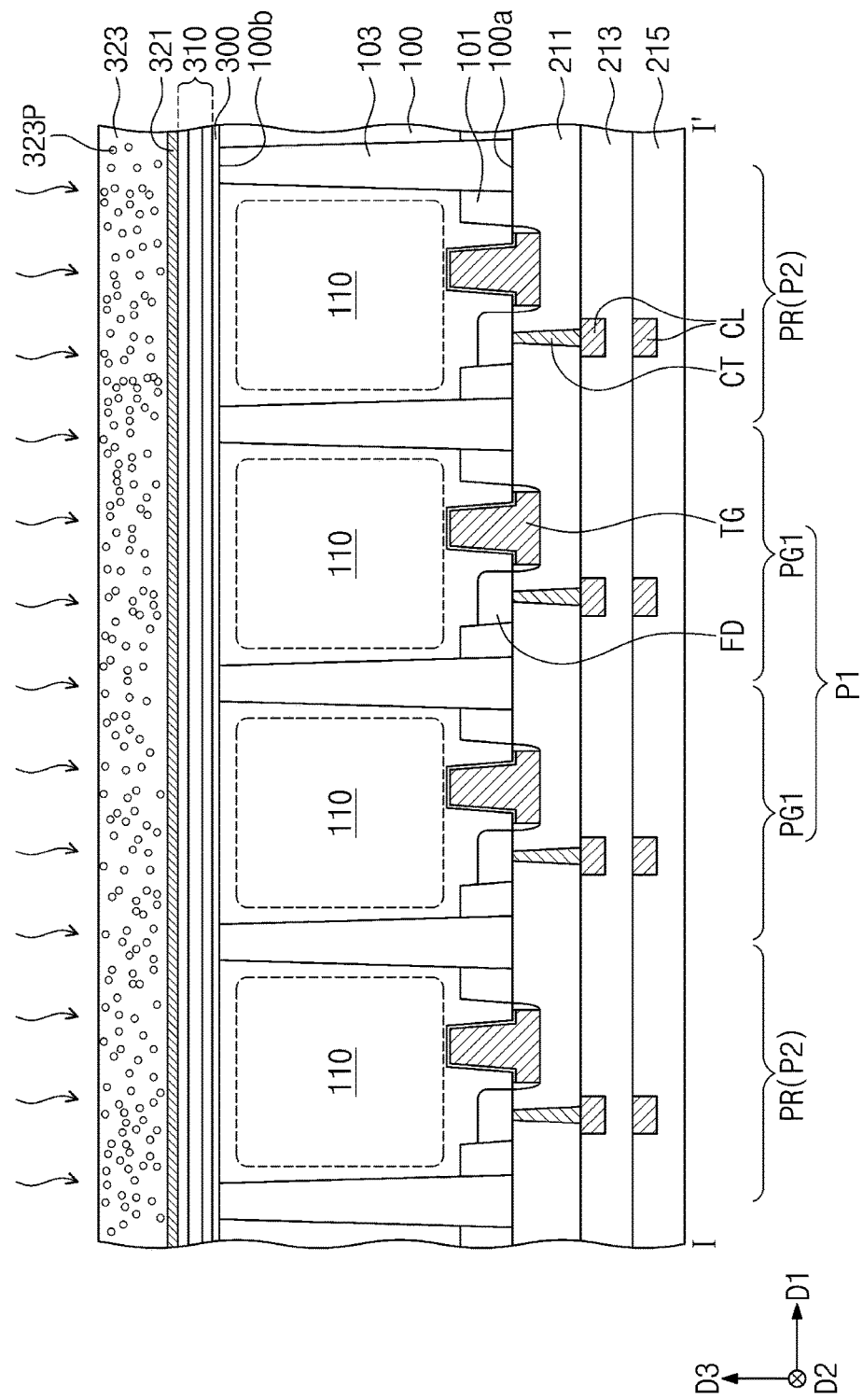

Referring to the exemplary embodiment of FIGS. 4A and 14, a thinning process of removing a portion of the semiconductor substrate 100 may be performed to reduce a vertical thickness (e.g., length in the third direction D3) of the semiconductor substrate 100. To thin the semiconductor substrate 100, the semiconductor substrate 100 may be turned over. A portion of the semiconductor substrate 100 may be removed by a grinding or polishing process, and an anisotropic or isotropic etching process may then be performed to remove remaining surface defects of the semiconductor substrate 100. The pixel isolation structure 103 may be exposed at the second surface 100b of the semiconductor substrate 100 by the thinning process performed on the semiconductor substrate 100. For example, an upper surface of the pixel isolation structure 103 may be located at substantially the same level as the second surface 100b of the semiconductor substrate 100. Alternatively, the upper surface of the pixel isolation structure 103 may be spaced apart from the second surface 100b of the semiconductor substrate 100 (e.g., in the third direction D3).

A fixed charge layer 300 may then be formed on the second surface 100b of the semiconductor substrate 100. In an exemplary embodiment, the fixed charge layer 300 may directly cover the second surface 100b of the semiconductor substrate 100. In an exemplary embodiment, the fixed charge layer 300 may be formed by depositing a metal oxide such as aluminum oxide and/or hafnium oxide.

A planarization insulating layer 310 may be formed on the fixed charge layer 300. For example, as shown in the exemplary embodiment of FIG. 14, a lower surface of the planarization insulating layer 310 may directly contact an upper surface of the fixed charge layer 300. The formation of the planarization insulating layer 310 may include sequentially depositing a first planarization layer 311, a second planarization layer 313, and a third planarization layer 315 (e.g., in the third direction D3). The first to third planarization layers 311, 313 and 315 may be formed of transparent insulating materials and may have different thicknesses. Each of the first to third planarization layers 311, 313 and 315 may include, for example, a metal oxide or silicon oxide.

A light blocking layer 321 and a low-refractive index layer 323 may be sequentially formed on the planarization insulating layer 310 (e.g., in the third direction D3). For example, the light blocking layer 321 may be formed of a metal material such as at least one compound selected from titanium, tungsten, and aluminum. The low-refractive index layer 323 may be formed of a dielectric material having a refractive index in a range of about 1.1 to about 1.3, as described above.

In an exemplary embodiment, the formation of the low-refractive index layer 323 may include forming a composition including an organic material and porogens on the light blocking layer 321 by a spin-coating process, and performing a soft bake process or a drying process to remove the porogens. Pores 323P may be formed by the removal of the porogens. For example, the porogen may be hydrocarbon having a structure expressed by CHx-CHy where 'x' and 'y' are numbers greater than 0. Sizes and a porosity of the pores 323P formed in the low-refractive index layer 323 may be modified depending on the amount and a concentration of the porogens in the low-refractive index layer 323.

In an exemplary embodiment, to prevent the refractive index of the low-refractive index layer 323 from being changed by processes for forming a low-refractive index pattern or prevent the low-refractive index layer 323 from being contaminated by the processes, a surface treatment process may be performed on a surface of the low-refractive index layer 323 after the formation of the low-refractive index layer 323 and before performing a patterning process.

For example, the low-refractive index layer 323 may have a hydroxyl group (—OH) on its surface. The hydroxyl group (—OH) of the low-refractive index layer 323 may exist in the form of a silanol group (Si—OH) or in the form of a water molecule in which hydrogen is combined with the silanol group (Si—OH), on the surface of the low-refractive index layer 323.

In an exemplary embodiment, at least one process selected from a thermal curing process, an ultraviolet (UV) curing process and an e-beam curing process may be performed for the surface treatment process on the surface of the low-refractive index layer 323 having the hydroxyl group (—OH). Therefore. Si—OH bonds may be broken to remove moisture (or water) of the surface of the low-refractive index layer 323.

In an exemplary embodiment, a process of forming a hydrophobic layer may be performed for the surface treatment process on the surface of the low-refractive index layer 323. For example, the formation of the hydrophobic layer may include reacting a silicon-containing compound with the surface of the low-refractive index layer 323 having the hydroxyl group (—OH). Here, the silicon-containing compound may be an organic silicon compound. For example, the organic silicon compound may include a CxHy-containing compound where 'x' and 'y' are integral numbers greater than or equal to 1. Silicon (Si) of the silicon-containing compound may react with the hydroxyl group (—OH) to form Si—O bonds. Therefore, the hydrophobic layer may be formed on the surface of the low-refractive index layer 323.

In an exemplary embodiment, a plasma treatment process using an inert gas may be performed for the surface treatment process on the surface of the low-refractive index layer 323. Pores existing on the surface of the low-refractive index layer 323 may be broken in the plasma treatment process. Therefore, the sizes of the pores may be reduced or the pores may be removed.

Figure 15:
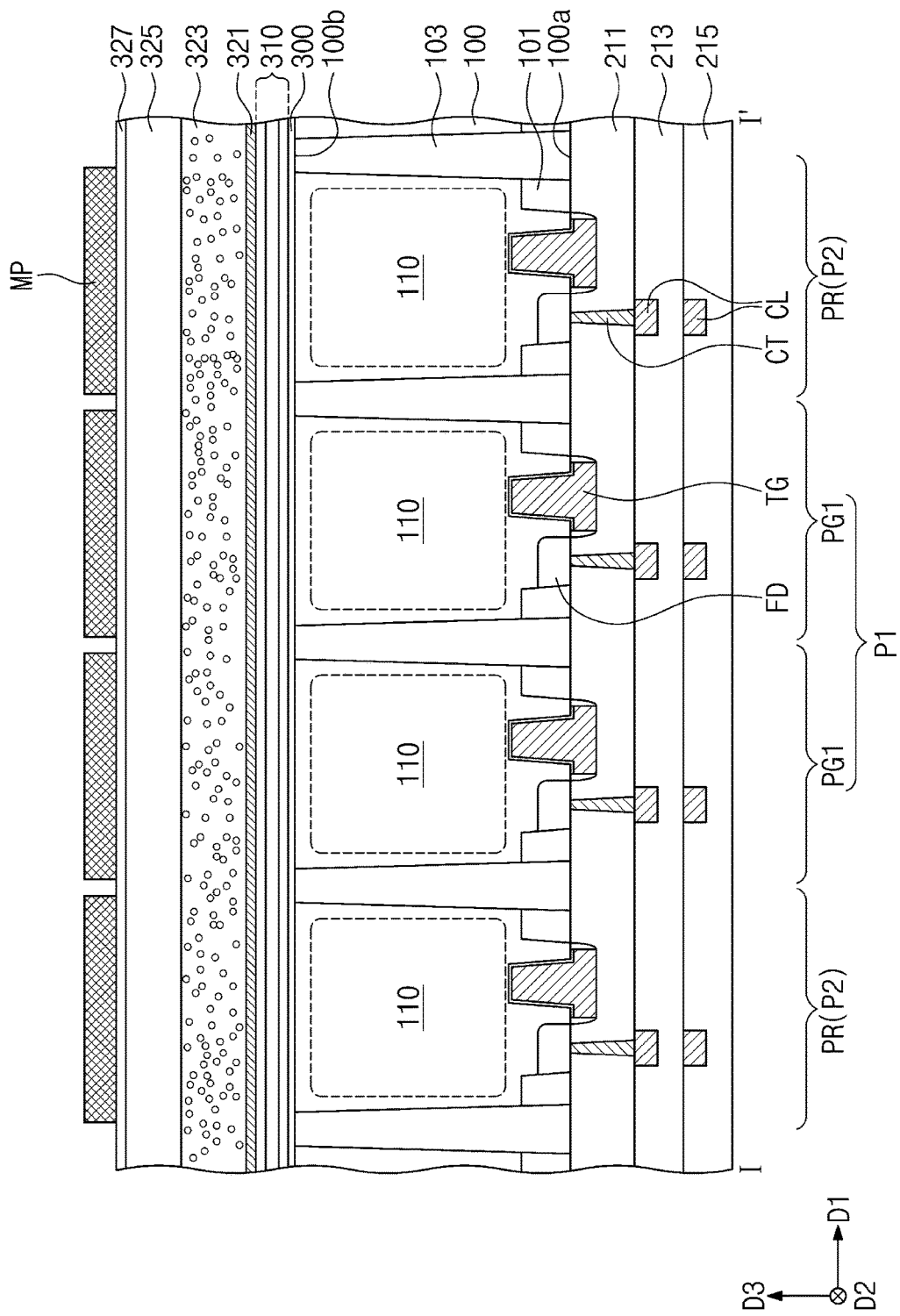

Referring to the exemplary embodiments of FIGS. 4A and 15, a sacrificial layer 325, an interface insulating layer 327 and a mask pattern MP may be sequentially formed on the low-refractive index layer 323 of which the surface is treated.

The sacrificial layer 325 may include a material having an etch selectivity with respect to the low-refractive index layer 323. For example, in an exemplary embodiment, the sacrificial layer 325 may have a carbon content of 70 wt % or more. For example, the sacrificial layer 325 may include a spin-on-hardmask (SOH). In an exemplary embodiment, the sacrificial layer 325 may be thicker (e.g., length in the third direction D3) than the low-refractive index layer 323. Since the surface of the low-refractive index layer 323 is treated, it is possible to prevent the material of the sacrificial layer 325 from permeating into the low-refractive index layer 323, even though the sacrificial layer 325 is in direct contact with the surface of the low-refractive index layer 323.

In an exemplary embodiment, the interface insulating layer 327 may be a silicon oxide layer. The mask pattern MP may include photoresist. The mask pattern MP may include openings exposing a top surface of the interface insulating layer 327.

Figure 16:
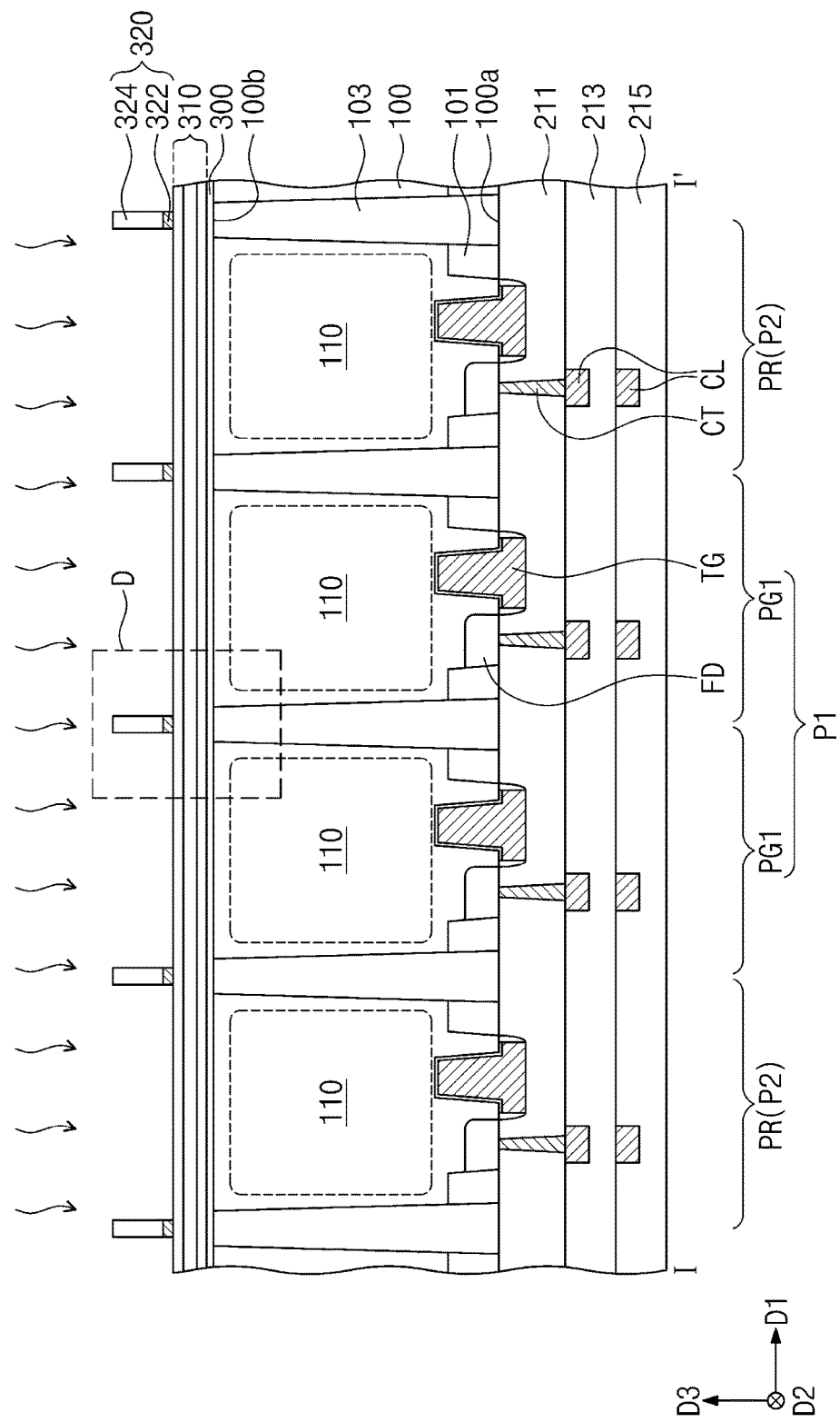
Figure 17A:
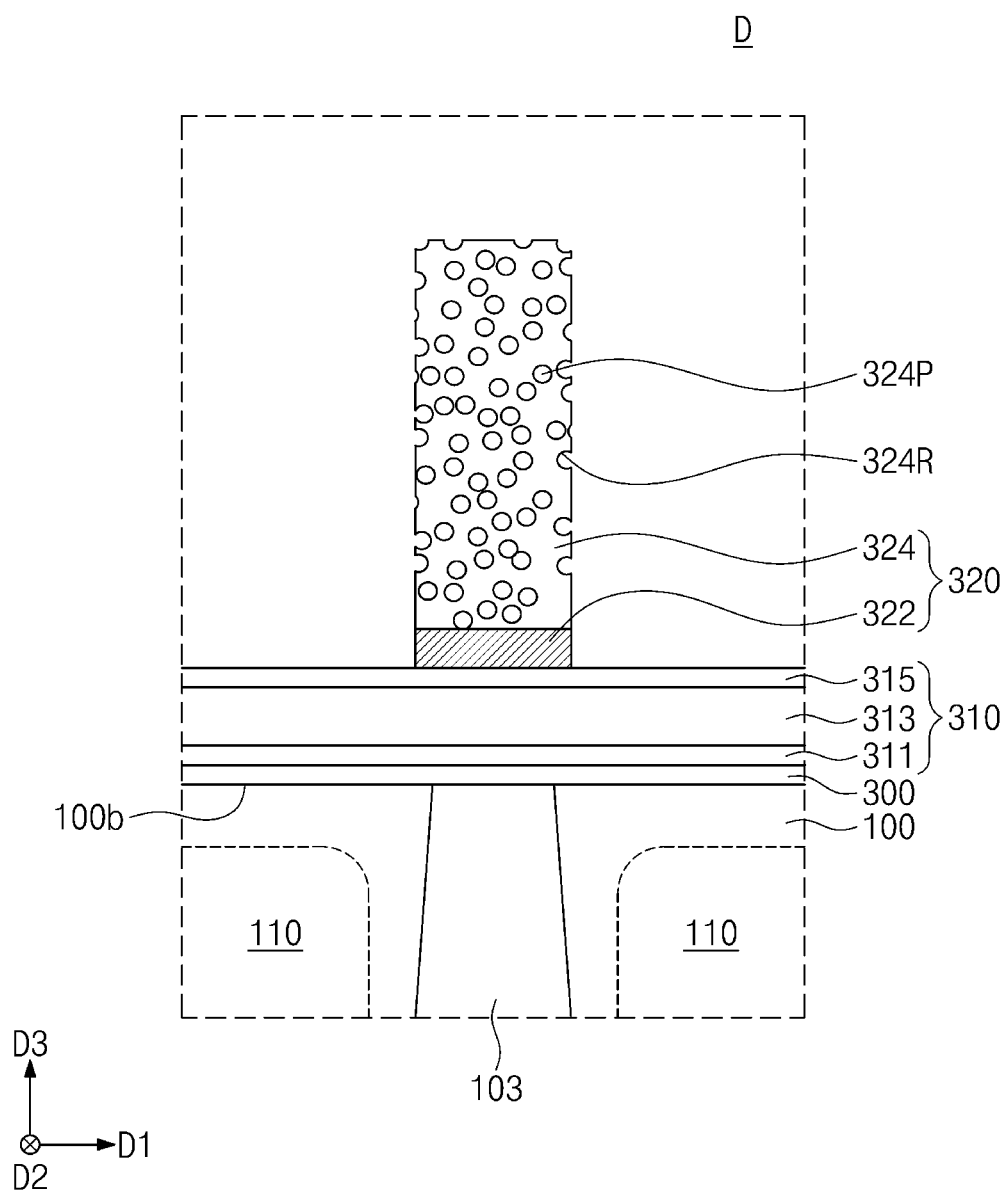
FIGS. 17A and 17B are enlarged views of portion 'D' of FIG. 16 illustrating a method for manufacturing an image sensor according to exemplary embodiments of the present inventive concepts.
Figure 17B:
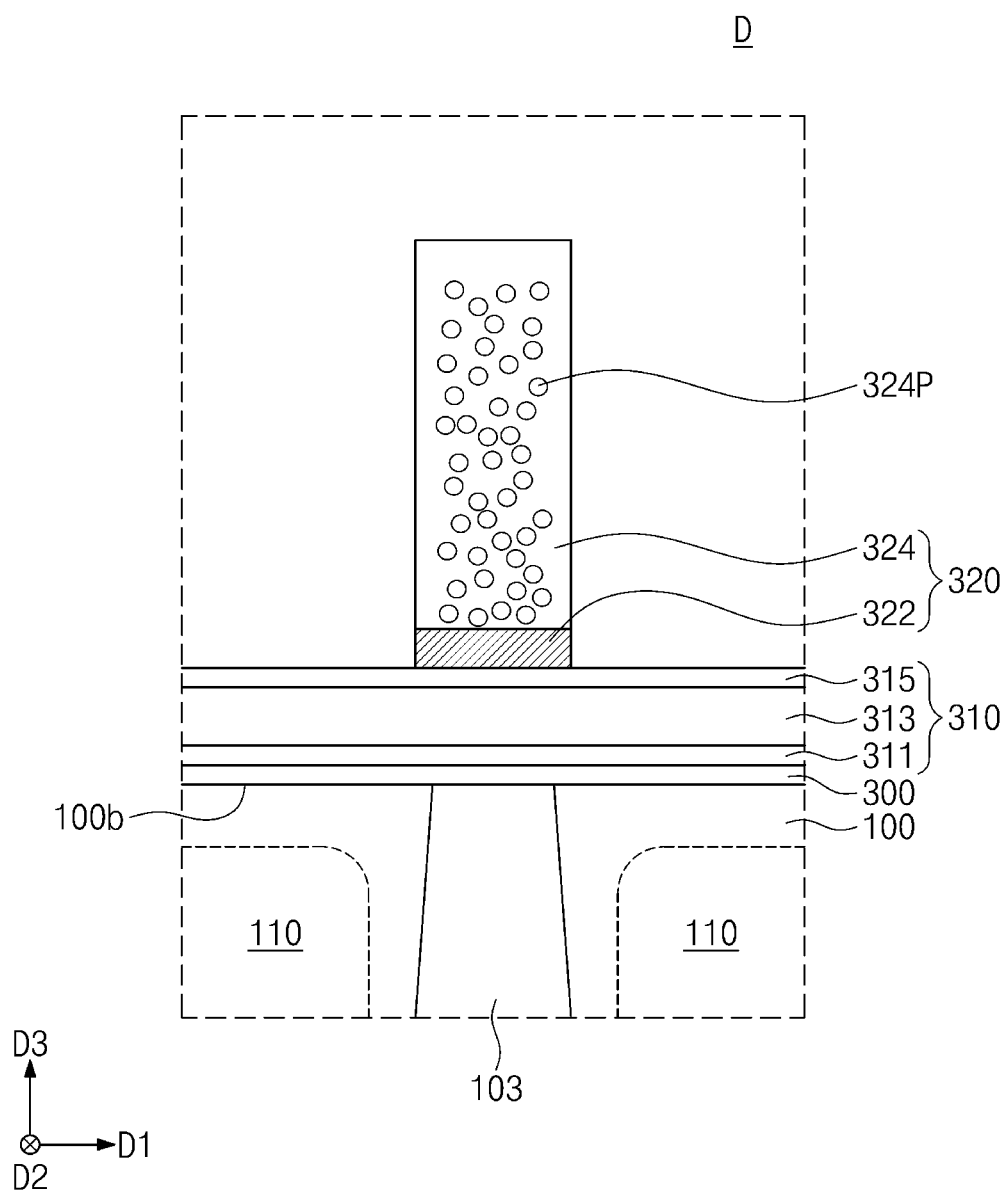

Referring to the exemplary embodiments of FIGS. 4A and 16, the interface insulating layer 327, the sacrificial layer 325, the low-refractive index layer 323 and the light blocking layer 321 may be sequentially patterned using the mask pattern MP. Therefore, a grid structure 320 including a light blocking pattern 322 and a low-refractive index pattern 324 may be formed. The mask pattern MP, the interface insulating layer 327 and the sacrificial layer 325 may be removed after the formation of the grid structure 320.

The grid structure 320 may overlap (e.g., in the third direction D3) with the pixel isolation structure 103 disposed in the semiconductor substrate 100 in a plan view (e.g., in a plane defined by the first direction D1 and the second direction D2) and may have openings defined to correspond to the first to third sub-pixel regions PG1, PG2, PR and PB, respectively, as described above. The grid structure 320 may include a first fence portion provided between adjacent first to third sub-pixel regions PG1, PG2, PR or PB in a plan view (e.g., in a plane defined by the first direction D1 and the second direction D2), and a second fence portion provided between adjacent pixel regions P), P2 and P3 in the plan view.

A surface treatment process may then be performed on the low-refractive index pattern 324. In an exemplary embodiment, the surface treatment process may include at least one process selected from the thermal curing process, the UV curing process, and the e-beam curing process, as described above. In an exemplary embodiment, the surface treatment process may include a process of forming a hydrophobic layer on the surface of the low-refractive index pattern 324. In an exemplary embodiment, the surface treatment process may include a plasma treatment process using an inert gas.

For example, referring to the exemplary embodiment of FIG. 17A, the plasma treatment process using the inert gas may be performed on a top surface and sidewalls of the low-refractive index pattern 324. The pores 324P existing on the surface of the low-refractive index pattern 324 may be broken by the plasma treatment process. Therefore, the top surface and the sidewalls of the low-refractive index pattern 324 may have recesses 324R which are irregularly recessed.

Alternatively, referring to the exemplary embodiment of FIG. 17B, the thermal curing process or the UV curing process may be performed on the top surface and the sidewalls of the low-refractive index pattern 324. Therefore, the pores 324P adjacent to the top surface and the sidewalls of the low-refractive index pattern 324 may be removed.

Figure 18:
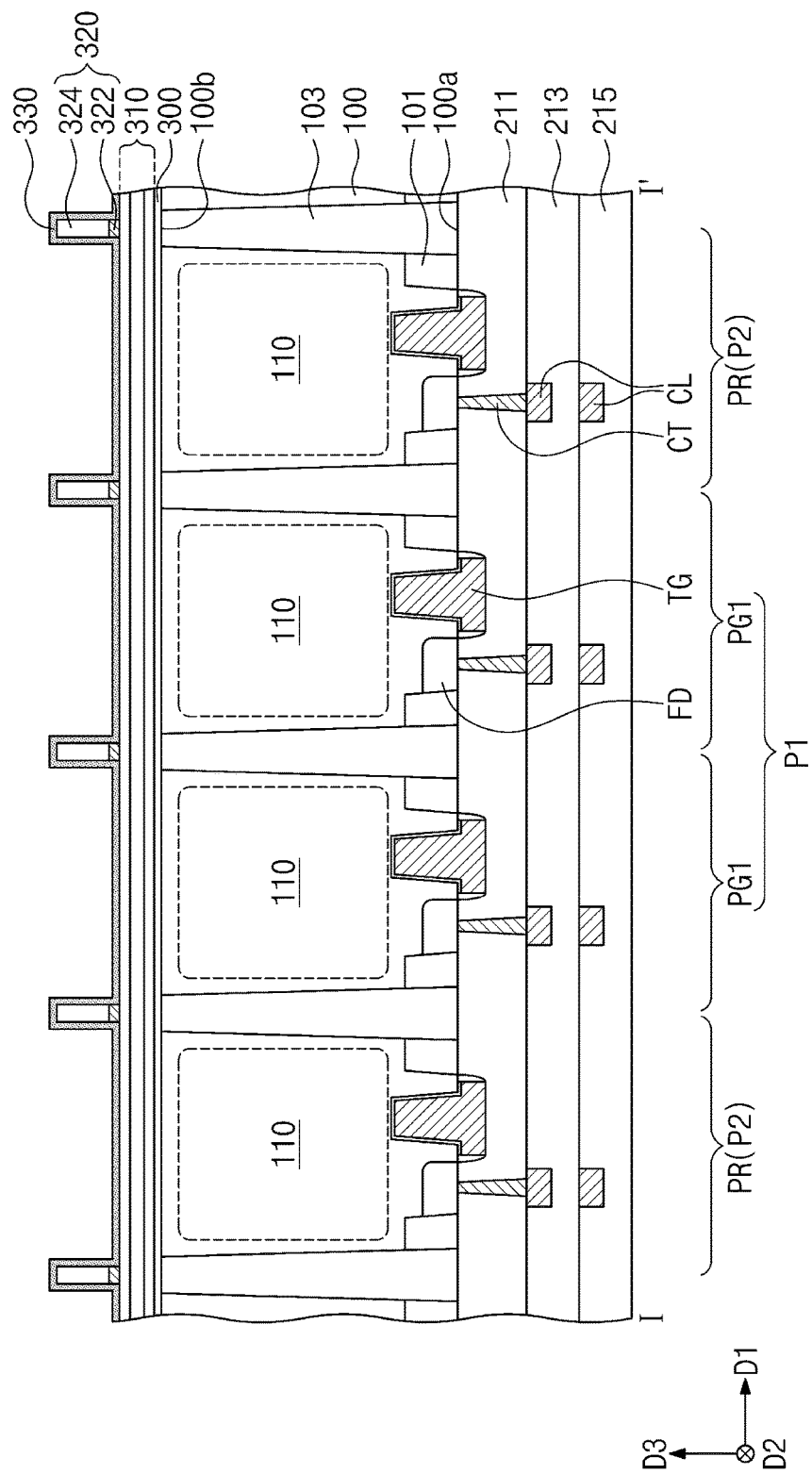

Referring to the exemplary embodiments of FIGS. 4A and 18, a protective layer 330 may be formed to conformally cover the surface of the grid structure 320 and a top surface of the planarization insulating layer 310 exposed by the grid structure 320. The protective layer 330 may be formed by a chemical vapor deposition (CVD) process or an atomic layer deposition (ALD) process. In an exemplary embodiment, the protective layer 330 may be formed at a temperature in a range of about 150 degrees Celsius to about 400 degrees Celsius. In an exemplary embodiment, the protective layer 330 may include silicon oxide including at least one compound selected from carbon (C) or nitrogen (N) and may have a thickness in a range of about 10 Å to about 200 Å.

Figure 19:
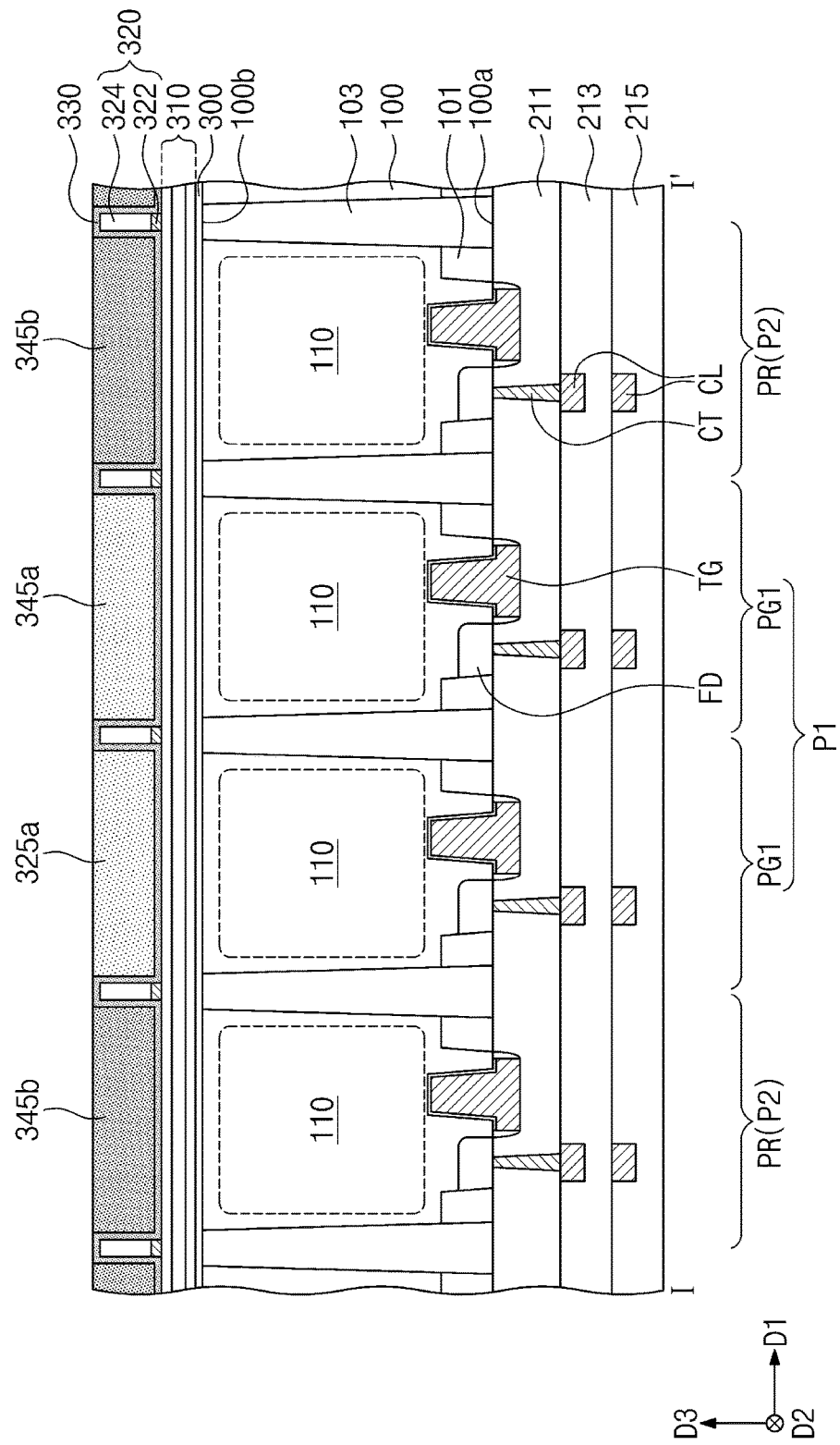

Referring to the exemplary embodiments of FIGS. 4A and 19, first to third color filters 345a and 345b may be formed on corresponding pixel regions P1, P2 and P3 (see FIG. 3). The first color filters 345a may be formed on the first pixel region P1, and second color filters 345b may be formed on the second pixel region P2. In addition, third color filters may be formed on the third pixel region P3.

The first to third color filters 345a and 345b may be formed by performing a plurality of spin-coating processes and a plurality of patterning processes. The first to third color filters 345a and 345b may fill the openings defined by the grid structure 320, respectively. For example, in an exemplary embodiment, the formation of the first to third color filters 345a and 345b may include sequentially performing a coating process of a photoresist composition including a dye or a pigment, a soft bake process, an exposure process, and a development process.

A micro lens array 350 including micro lenses 353 respectively corresponding to the first to third sub-pixel regions PG1, PG2, PR and PB may be formed as illustrated in the exemplary embodiments of FIGS. 4A and 4B.

For example, the formation of the micro lens array 350 may include forming a light-transmitting photoresist layer, patterning a portion of the photoresist layer to form photoresist patterns corresponding to the first to third sub-pixel regions PG1, PG2, PR and PB, respectively, and reflowing the photoresist patterns. Therefore, the micro lenses 353 having shapes that are upwardly convex with a certain curvature may be formed. In addition, after the formation of the micro lenses 353, a flat portion 351 having a substantially uniform thickness may be formed under the micro lenses 353. Since the micro lens array 350 is formed using the process of coating flat top surfaces of the first to third color filters 345a and 345b with the light-transmitting photoresist layer, the flat portion 351 may have the substantially uniform thickness. The micro lenses 353 may have a substantially constant curvature on the top surfaces of the first to third color filters 345a and 345b.

A passivation layer 360 may then be formed to conformally cover surfaces of the micro lenses 353. In an exemplary embodiment, the passivation layer 360 may be formed of an inorganic oxide.

FIGS. 20 to 24 are cross-sectional views taken along the line I-I' of FIG. 4A to illustrate a method for manufacturing an image sensor according to exemplary embodiments of the present inventive concepts.

Figure 20:
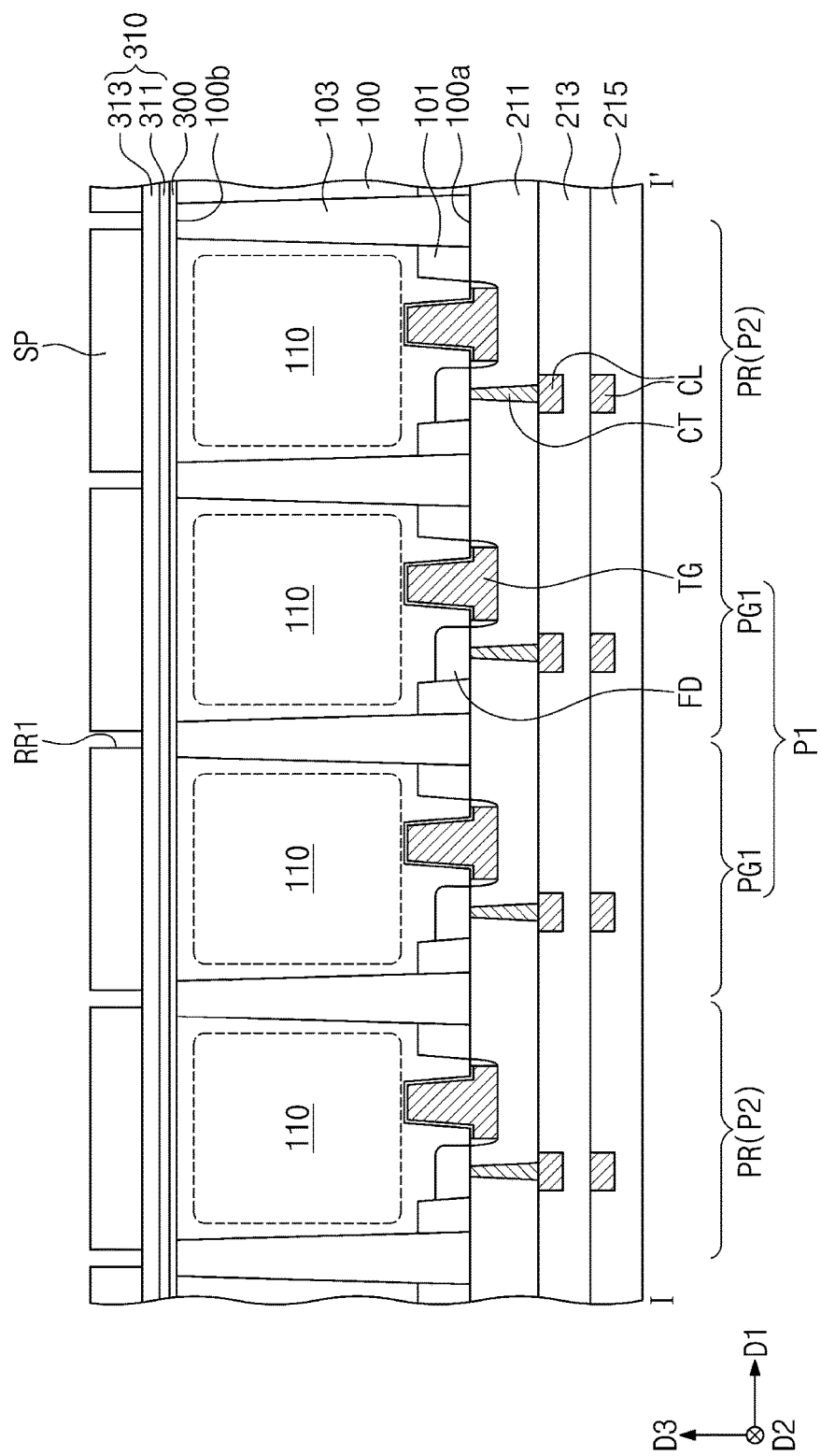
FIGS. 20 to 24 are cross-sectional views taken along line I-I' of FIG. 4A illustrating a method for manufacturing an image sensor according to exemplary embodiments of the present inventive concepts.

Referring to the exemplary embodiments of FIGS. 4A and 20, after performing the thinning process on the second surface 100b of the semiconductor substrate 100 of FIG. 13, the fixed charge layer 300 may be formed on the second surface 100b. A planarization insulating layer 310 may then be formed on the fixed charge layer 300. In an exemplary embodiment, the planarization insulating layer 310 may include first and second planarization layers 311 and 313 which are sequentially deposited (e.g., in the third direction D3). The first and second planarization layers 311 and 313 may be formed of transparent insulating materials and may have different thicknesses and different refractive indexes. In an exemplary embodiment, the first planarization layer 311 may include a hafnium oxide layer, a tantalum oxide layer, or a titanium oxide layer. The second planarization layer 313 may include a silicon oxide layer such as TEOS.

Sacrificial patterns SP may then be formed on the planarization insulating layer 310. The thicknesses of the sacrificial patterns SP (e.g., length in the third direction D3) may be greater than a thickness of the planarization insulating layer 310. In an exemplary embodiment, the formation of the sacrificial patterns SP may include coating a top surface of the planarization insulating layer 310 with a sacrificial layer, forming photoresist patterns on the sacrificial layer, and etching the sacrificial layer using the photoresist patterns as etch masks. A preliminary recess region RR1 having a grid shape may be defined on the planarization insulating layer 310 by the sacrificial patterns SP. The preliminary recess region RR1 may expose the planarization insulating layer 310. In an exemplary embodiment, the sacrificial patterns SP may have a carbon content of about 70 wt % or more. For example, the sacrificial patterns SP may include a spin-on-hardmask (SOH).

Figure 21:
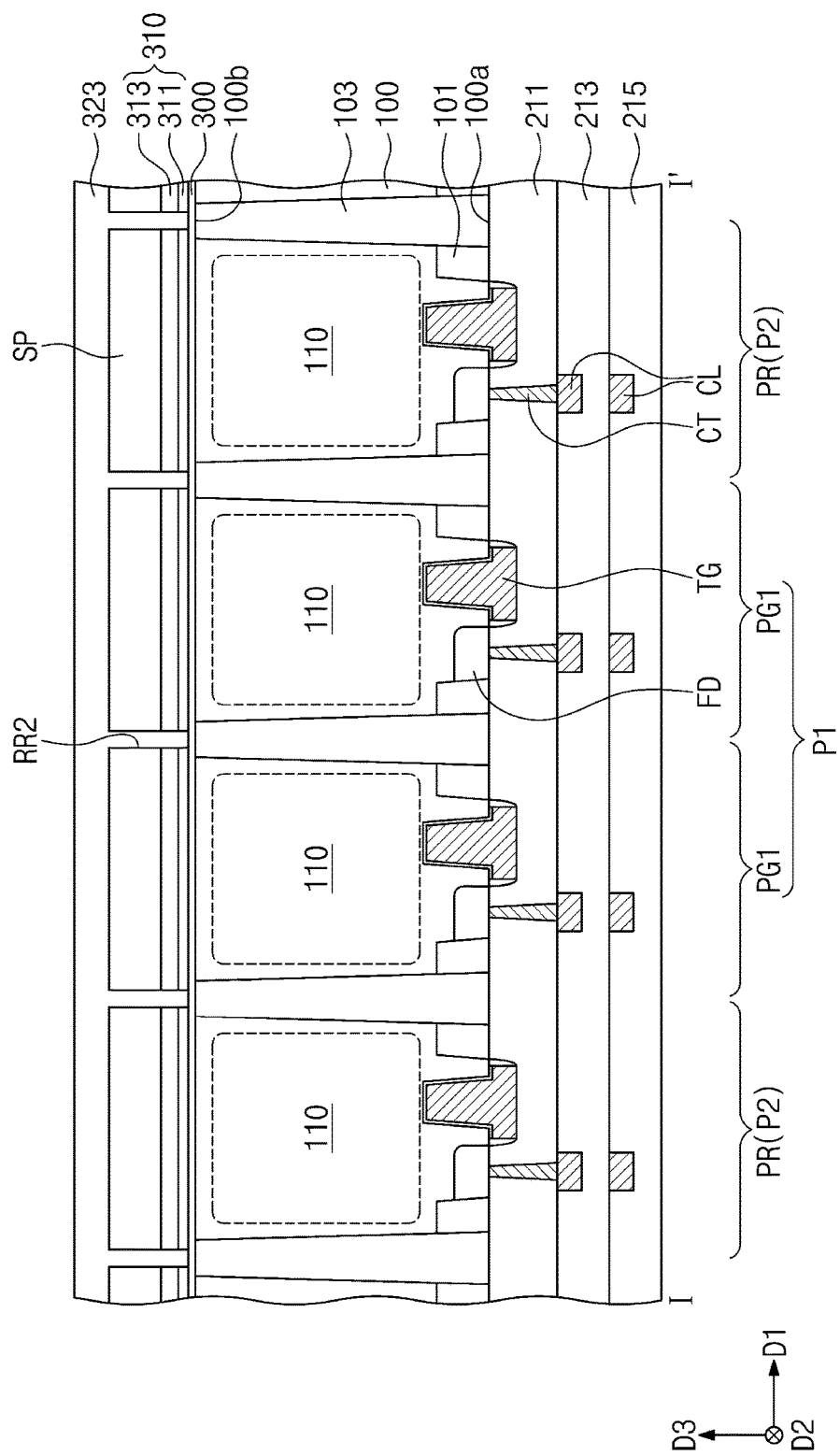

Referring to the exemplary embodiment of FIG. 21, the planarization insulating layer 310 may be patterned using the sacrificial patterns SP as etch masks. Therefore, a recess region RR2 exposing the fixed charge layer 300 may be formed in the planarization insulating layer 310. Alternatively, the fixed charge layer 300 may also be etched in the formation of the recess region RR2. Therefore, in this embodiment, the recess region RR2 may expose the pixel isolation structure 103.

After the formation of the recess region RR2, a low-refractive index layer 323 may be formed to fill the recess region RR2. As described above, the formation of the low-refractive index layer 323 may include forming a composition including an organic material and porogens by a spin-coating process, and performing a soft bake process or a drying process to remove the porogens. Therefore, the low-refractive index layer 323 including pores may be formed. As shown in the exemplary embodiment of FIG. 21, the low-refractive index layer 323 may completely fill the recess region RR2 and may cover top surfaces of the sacrificial patterns SP.

Figure 22:
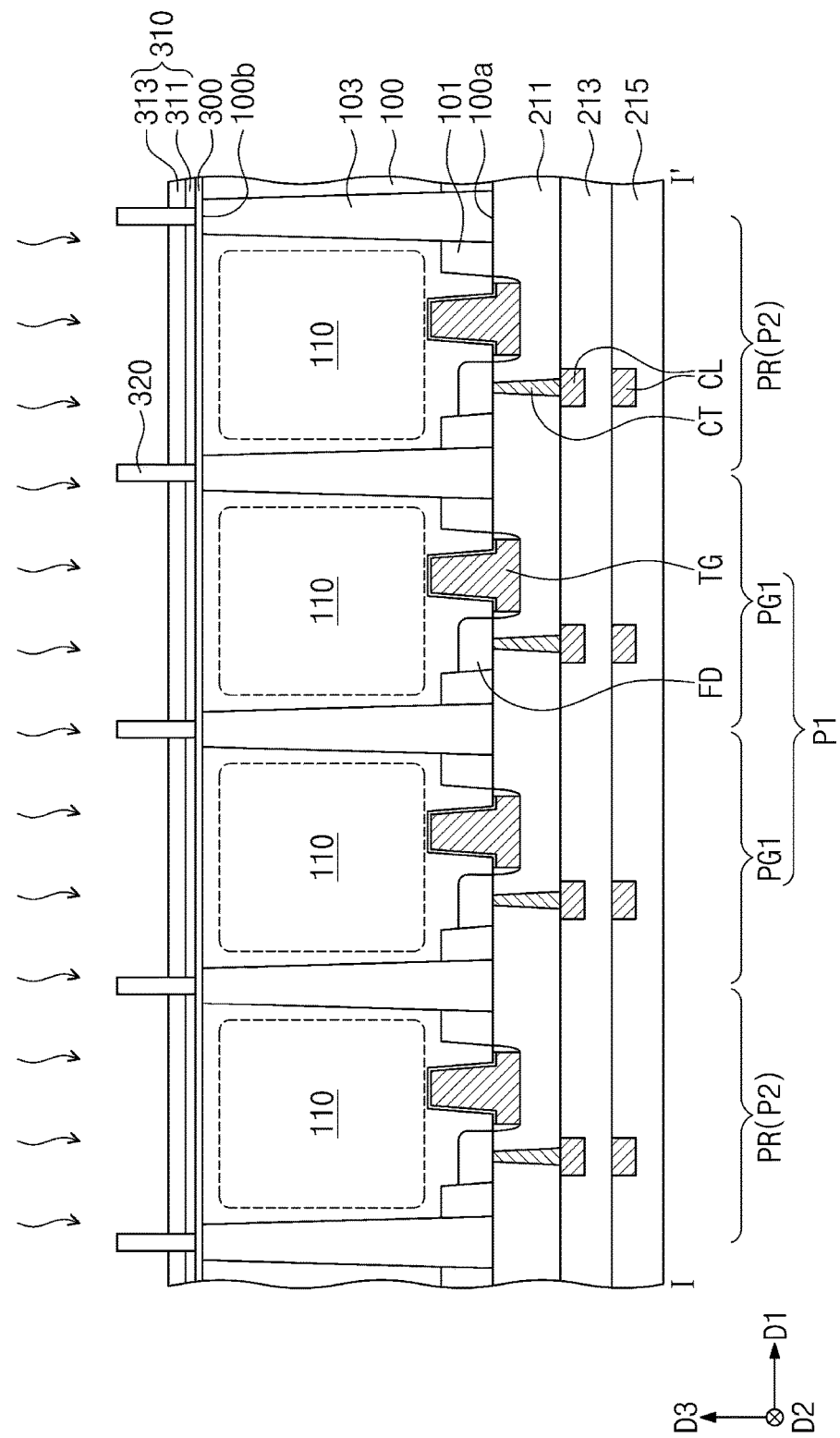

Referring to the exemplary embodiment of FIG. 22, a planarization process may be performed on the low-refractive index layer 323 until the top surfaces of the sacrificial patterns SP are exposed. Therefore, a grid structure 320 having a low-refractive index pattern may be formed.

After the formation of the grid structure 320, the sacrificial patterns SP may be selectively removed to expose the top surface of the planarization insulating layer 310 of the first to third sub-pixel regions PG1. PG2, PR and PB. For example, in an exemplary embodiment, the sacrificial patterns SP may be removed by an ashing process using oxygen. However, exemplary embodiments of the present inventive concepts are not limited thereto. Openings defined by sidewalls of the grid structure 320 and the top surface of the planarization insulating layer 310 may be formed by the removal of the sacrificial patterns SP.

A surface treatment process may then be performed on the grid structure 320 (e.g., the low-refractive index pattern). In an exemplary embodiment, the surface treatment process may include at least one of the thermal curing process, the UV curing process, the e-beam curing process, the process of forming the hydrophobic layer on the surface of the low-refractive index pattern, and the plasma treatment process using the inert gas, as described above with reference to the exemplary embodiments of FIGS. 16, 17A and 17B.

Figure 23:
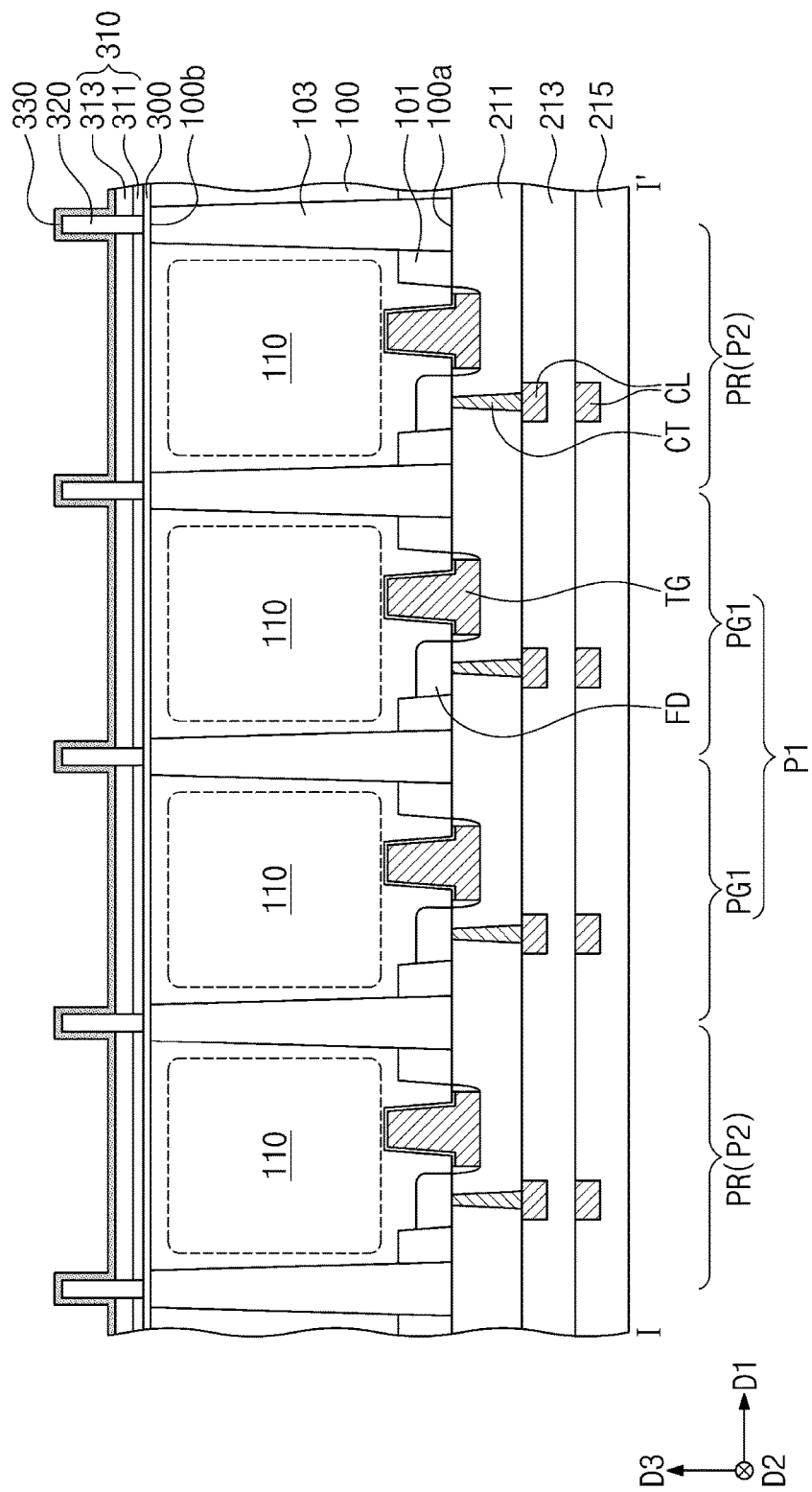

Referring to the exemplary embodiment of FIG. 23, a protective layer 330 may be conformally formed after the selective removal of the sacrificial patterns SP. In an exemplary embodiment, the protective layer 330 may have a substantially uniform thickness and may cover the top surface of the planarization insulating layer 310 and a top surface and the sidewalls of the grid structure 320.

Figure 24:
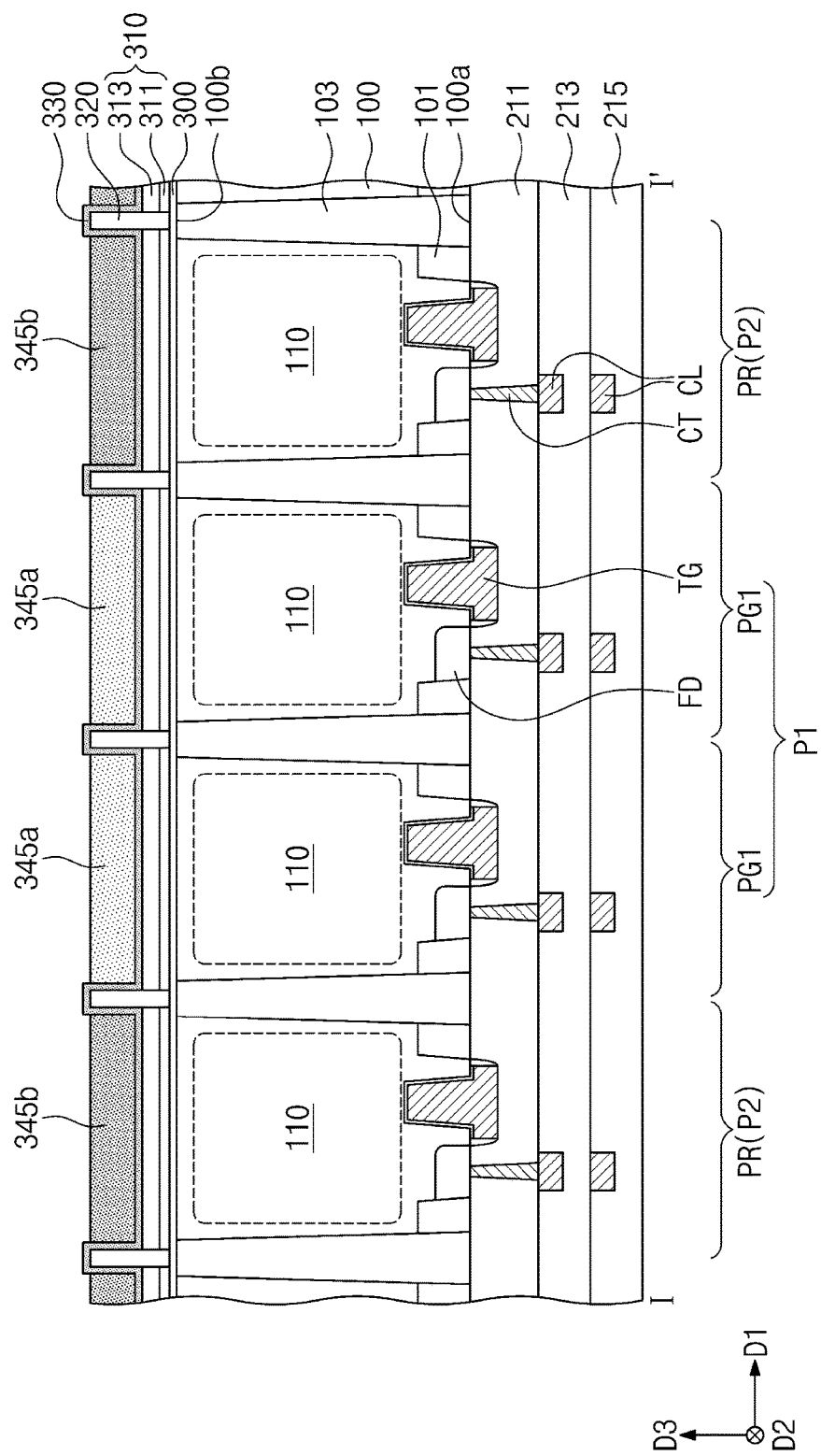

Referring to the exemplary embodiment of FIG. 24, first to third color filters 345a and 345b may be formed in the first to third pixel regions P1, P2 and P3 to correspond to the first to third sub-pixel regions PG1, PG2, PR, PB, respectively. The formation of the first to third color filters 345a and 345b may include coating first to third color filter layers corresponding to the first to third pixel regions P1, P2 and P3, respectively, and performing a planarization process on the first to third color filter layers. Therefore, the first to third color filters 345a and 345b in the first to third pixel regions P1, P2 and P3 may be formed. In an exemplary embodiment, the first to third color filters 345a and 345b may have substantially flat top surfaces. Thereafter, the micro lens array 350 including the micro lenses 353 respectively corresponding to the sub-pixel regions PG1/PG2, PR and PB may be formed.

According to an exemplary embodiment of the present inventive concepts, the surface treatment process may be performed before and after the patterning process for forming the low-refractive index pattern, and the protective layer may be formed to conformally cover the surface of the low-refractive index pattern. Therefore, it is possible to prevent moisture and/or contaminants from permeating into the low-refractive index pattern. As a result, an increase in refractive index of the low-refractive index pattern may be prevented, and the optical characteristics of the image sensor may be improved.

While the inventive concepts have been described with reference to exemplary embodiments, it will be apparent to those skilled in the art that various changes and modifications may be made without departing from the spirits and scopes of the present inventive concepts. Therefore, it should be understood that the above exemplary embodiments are not limiting, but illustrative. Thus, the scopes of the present inventive concepts shall not be restricted or limited by the foregoing description of such exemplary embodiments.

What is claimed is:

1. An image sensor comprising:
   a semiconductor substrate including a plurality of pixel regions arranged in a first direction and a second direction that are parallel to an upper surface of the semiconductor substrate, the first direction is perpendicular to the second direction;
   a grid structure extending in the first direction and the second direction on the semiconductor substrate to define openings corresponding to the plurality of the pixel regions, respectively;
   color filters disposed in the openings of the grid structure, respectively; and
   a protective layer covering sidewalls of the grid structure and bottom surfaces of the color filters,
   wherein the grid structure comprises a light blocking pattern and a low-refractive index pattern which are sequentially stacked,
   wherein the low-refractive index pattern includes:
   a low-refractive index region having pores; and
   a buffer region surrounding sidewalls and a top surface of the low-refractive index region and terminating on a top surface of the light blocking pattern, the buffer region contacting the protective layer, and
   wherein a density of the pores in the buffer region is less than a density of the pores in the low-refractive index region.

2. The image sensor of claim 1, wherein the protective layer is spaced apart from the pores in the low-refractive index region and contacts the buffer region.

3. The image sensor of claim 1, wherein:
   the grid structure comprises a low-refractive index pattern including pores; and
   the low-refractive index pattern includes a low-refractive index region and a buffer region surrounding the low-refractive index region, wherein the buffer region is adjacent to the protective layer and the low-refractive index region is spaced apart from the protective layer,
   wherein a density of the pores in the buffer region is less than a density of the pores in the low-refractive index region.

4. The image sensor of claim 1, wherein:
the grid structure comprises a low-refractive index pattern including pores,
wherein a surface of the low-refractive index pattern has a plurality of recesses.

5. The image sensor of claim 4, wherein the protective layer fills the recesses.

6. The image sensor of claim 1, wherein a top surface of the grid structure is located at a level that is higher than or substantially equal to a level of top surfaces of the color filters.

7. The image sensor of claim 1, wherein the grid structure has an aspect ratio in a range of about 2:1 to about 5:1.

8. The image sensor of claim 1, wherein the pixel regions include a first pixel region and a second pixel region, each of the first and second pixel regions including a plurality of sub-pixel regions,
wherein the grid structure having sub-openings corresponding to the sub-pixel regions, respectively,
wherein the color filters comprise:
first color filters corresponding to the sub-pixel regions of the first pixel region; and
second color filters corresponding to the sub-pixel regions of the second pixel region,
wherein at least two of the second color filters are disposed between adjacent first color filters.

9. The image sensor of claim 1, further comprising:
a planarization insulating layer disposed between the semiconductor substrate and the grid structure and between the semiconductor substrate and the color filters.

10. The image sensor of claim 1, further comprising:
a micro lens array disposed on the color filters, the micro lens array including:
a flat portion covering top surfaces of the color filters and having a substantially uniform thickness on the top surfaces of the color filters; and
a plurality of micro lenses provided on the flat portion and corresponding to the plurality of pixel regions, respectively.

11. An image sensor comprising:
a semiconductor substrate including a plurality of pixel regions that are spaced apart from each other;
a plurality of color filters disposed on the semiconductor substrate and corresponding to the pixel regions, respectively;
a grid structure disposed on the semiconductor substrate and disposed between adjacent color filters of the plurality of color filters; and
a protective layer covering a top surface and sidewalls of the grid structure and bottom surfaces of the plurality of color filters,
wherein the grid structure comprises a low-refractive index pattern including:
a low-refractive index region having pores; and
a buffer region surrounding the low-refractive index region and contacting the protective layer, the buffer region and the low-refractive index region are composed of a same material.

12. The image sensor of claim 11, wherein the protective layer is spaced apart from the pores in the low-refractive index pattern.

13. The image sensor of claim 11, wherein a density of the pores in the buffer region is less than a density of the pores in the low-refractive index region.

14. The image sensor of claim 11, wherein the protective layer includes a SiOCH layer, a SiOC layer, a SiOF layer, a SiCN layer, or a SiC layer.

15. The image sensor of claim 11, further comprising:
a planarization insulating layer disposed between the semiconductor substrate and the grid structure and between the semiconductor substrate and the color filters.

16. An image sensor comprising:
a semiconductor substrate including a first pixel region and a second pixel region including a first surface and a second surface opposite to each other, wherein each of the first and second pixel regions includes a plurality of sub-pixel regions;
photoelectric conversion regions provided in each of the sub-pixel regions of the first and second pixel regions in the semiconductor substrate;
a pixel isolation structure disposed in the semiconductor substrate to define the sub-pixel regions of the first and second pixel regions, the pixel isolation structure surrounding each of the photoelectric conversion regions in a plan view;
a micro lens array disposed on the second surface of the semiconductor substrate and including a plurality of micro lenses corresponding to the plurality of sub-pixel regions;
a color filter array provided between the micro lens array and the second surface of the semiconductor substrate, the color filter array comprising:
first color filters corresponding to the sub-pixel regions of the first pixel region; and
second color filters corresponding to the sub-pixel regions of the second pixel region;
a grid structure provided on the second surface of the semiconductor substrate and disposed between adjacent color filters of the color filter array, the grid structure comprises a light blocking pattern and a low-refractive index pattern; and
a protective layer covering sidewalls of the grid structure and bottom surfaces of the first and second color filters,
wherein the low-refractive index pattern including:
a low-refractive index region having pores; and
a buffer region surrounding sidewalls and a top surface of the low-refractive index region and terminating on a top surface of the light blocking pattern, the buffer region contacting the protective layer, and
wherein the protective layer is spaced apart from the pores in the low-refractive index region and contacts the buffer region of the low-refractive index pattern.

17. The image sensor of claim 16, wherein the protective layer has a substantially uniform thickness on the sidewalls of the grid structure and the bottom surfaces of the first and second color filters.

18. The image sensor of claim 16, wherein the protective layer has a thickness in a range of about 10 Å to about 200 Å.

19. The image sensor of claim 1, wherein the buffer region and the low-refractive index region are composed of a same material.

20. The image sensor of claim 16, wherein the buffer region and the low-refractive index region are composed of a same material.

* * * * *